United States Patent [19]

Kondo et al.

[11] Patent Number: 5,783,845
[45] Date of Patent: Jul. 21, 1998

[54] SEMICONDUCTOR DEVICE AND ITS MANUFACTURE UTILIZING CRYSTAL ORIENTATION DEPENDENCE OF IMPURITY CONCENTRATION

[75] Inventors: Makoto Kondo; Chikashi Anayama; Hajime Shoji, all of Kawasaki, Japan

[73] Assignee: Fujitsu Limited, Kawasaki, Japan

[21] Appl. No.: 789,665

[22] Filed: Jan. 27, 1997

Related U.S. Application Data

[62] Division of Ser. No. 398,506, Mar. 3, 1995, Pat. No. 5,668,048.

[30] Foreign Application Priority Data

Mar. 4, 1994 [JP] Japan ............... 6-034883

[51] Int. Cl.[6] .................... H01L 29/088; H01L 29/04
[52] U.S. Cl. .................... 257/198; 257/392; 257/627
[58] Field of Search ................. 257/198, 392, 257/627, 197

[56] References Cited

U.S. PATENT DOCUMENTS

| | | | |
|---|---|---|---|
| 4,839,307 | 6/1989 | Imanaka et al. | 437/129 |
| 4,932,033 | 6/1990 | Miyazawa et al. | 372/46 |
| 5,341,007 | 8/1994 | Kuwata | 257/194 |
| 5,418,374 | 5/1995 | Morita et al. | 257/13 |
| 5,598,015 | 1/1997 | Tanoue et al. | 257/198 |

FOREIGN PATENT DOCUMENTS

37 28 524  3/1988  Germany .............. 257/198

OTHER PUBLICATIONS

Miller, D.L., "Lateral P-N junction formation in GaAs molecular beam epitaxy by crystal plane dependent doping." *Applied Physics Letters*, vol. 47, No. 12, Dec. 1985, pp. 1309–1311.

Tamamura et al., "Carbon incorporation in metalorganic chemical vapor deposition (Al,Ga)As films grown on (100), (311)A, and (311)B oriented GaAs substrates," *Appl. Phys. Lett.*, vol. 50, No. 17, Apr. 27, 1987, pp. 1149–1151.

Lum et al., "$_{13}C$ Isotopic Labeling Studies of Growth Mechanisms in the Metalorganic Vapor Phase Epitaxy of GaAs," *Journal of Crystal Growth* 93 (1988), pp. 120–126.

Ren et al., "GaAs–AlGaAs HBT with Carbon Doped Base Layer Grown by MOMBE," *Electronics Letters*, vol. 26, No. 11, May 24, 1990, pp. 724–725.

Li et al., "Molecular Beam Epitaxial GaAs/AlGaAs Heterojunction Bipolar Transistors on (311)A GaAs Substrates with All–Silicon Doping," *IEEE Electron Device Letters*, vol. 13, No. 1, Jan. 1992, pp. 29–31.

Caneau et al., Dependence of doping on substrate orientation of GaAs: C grown by OMVPE, *Journal for Crystal Growth* 118 (1992), pp. 467–469.

Kondo et al., "Crystal orientation dependence of impurity dopant incorporation in MOVPE–grown III–V materials," *Journal of Crystal Growth* 124 (1992), pp. 449–456.

Proceedings of the Seventh International Conference on Metalorganic Vapor Phase Epitaxy, Yokohama, Japan, May 31–Jun. 3, 1994, Kondo et al., "Dependence of carbon incorporation on crystallographic orientation during metalorganic vapor phase epitaxy of GaAs and AlGaAs," *Journal of Crystal Growth*, vol. 145, Nos. 1–4, Dec. 1994, ISSN 0022–0248, pp. 390–396.

*Primary Examiner*—Donald Monin
*Attorney, Agent, or Firm*—Staas & Halsey

[57] ABSTRACT

A technique for manufacturing a semiconductor device includes the steps of preparing a stepped substrate made of a group III-V compound semiconductor and having a flat surface exposing a (1 0 0) plane and a slanted surface exposing an (n 1 1)B plane whrerein n is a real number of about $1 \leq n$, and epitaxially growing the group III-V compound semiconductor to form an epitaxial layer on the surface of the stepped substrate while doping p- and n-type impurities, selectively at the same time or, alternatively, under conditions such that the grown epitaxial layer has an n-type region on the slanted surface and a p-type region on the flat surface.

9 Claims, 13 Drawing Sheets

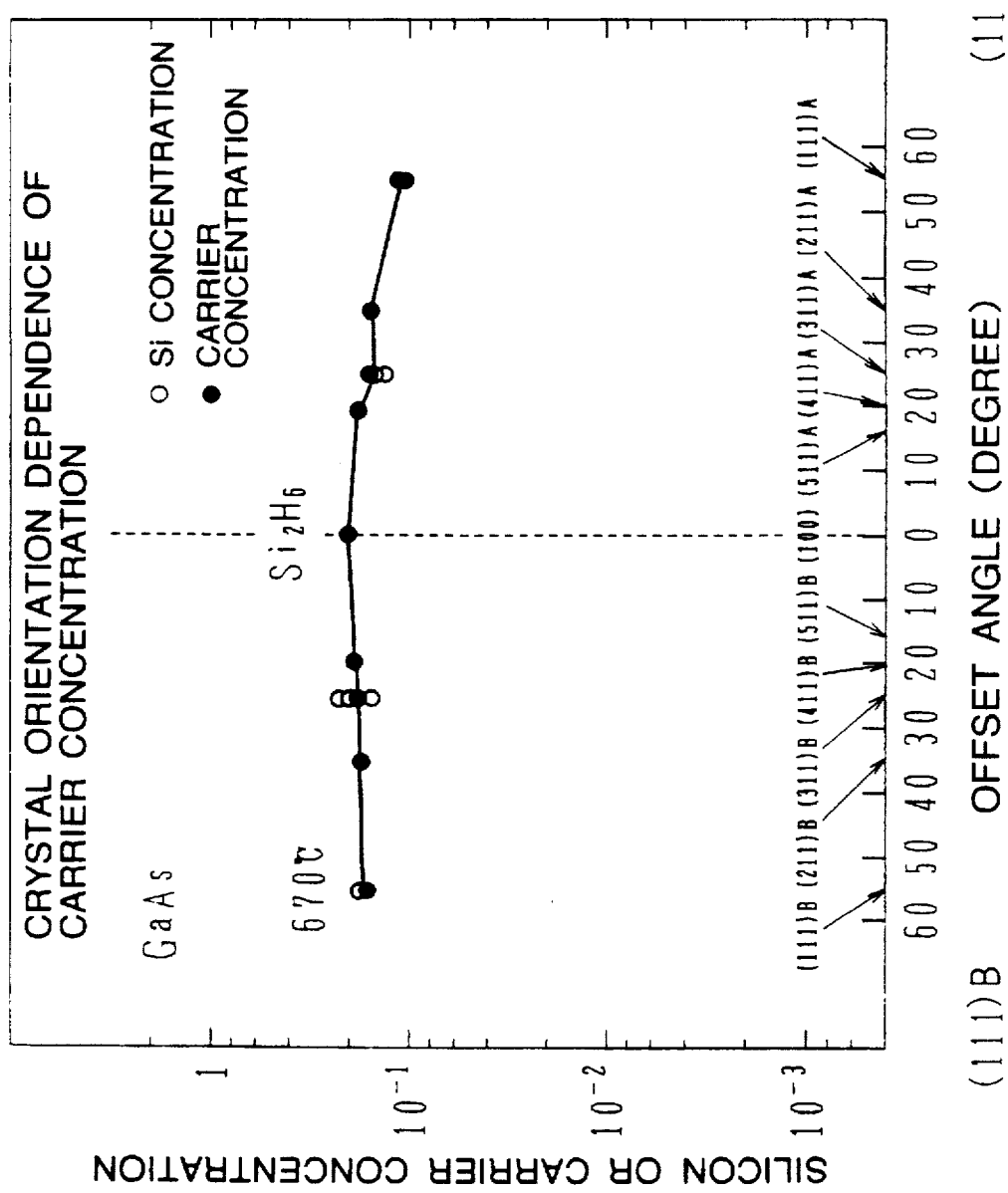

SEMICONDUCTOR DEVICE AND ITS MANUFACTURE UTILIZING CRYSTAL ORIENTATION DEPENDENCE OF IMPURITY CONCENTRATION

This application is a division of application Ser. No. 08/398,506, filed Mar. 3, 1995, now U.S. Pat. No. 5,668,048.

BACKGROUND OF THE INVENTION a). Field of the Invention

The present invention relates to a manufacture of a semiconductor device, and more particularly to a technology of manufacturing a semiconductor device with a p-n junction or junctions formed by using group III-V compound semiconductor.

b). Description of the Related Art

A conventional compound semiconductor device has been formed mainly on a flat substrate, particularly a substrate having a flat surface of crystallographic (1 0 0) plane, and made of GaAs, InP or other compound semiconductors, because a semiconductor crystal of excellent quality can be epitaxially grown relatively easily on the substrate having the (1 0 0) plane and also because a flat wafer can be easily cleaved to fine or minute semiconductor devices.

The manufacture of semiconductor devices having a new structure has been studied recently by epitaxially growing a semiconductor crystal on a semiconductor substrate having not only a flat (1 0 0) plane surface but also other surfaces of other crystal orientations as well as steps, grooves, or ridges. It is expected that semiconductor devices having an excellent performance difficult to be realized on a (1 0 0) plane substrate can be manufactured by using substrates having surfaces of crystal orientations other than the (1 0 0) plane is well as steps, grooves, or ridges.

It is an important technique of semiconductor device manufacture to control the conductivity type and carrier concentration of a semiconductor crystal by doping impurities. It is therefore important to have a knowledge of crystal orientation dependence of p-type or n-type impurity doping in a crystal epitaxially grown on a semiconductor substrate.

The inventors have studied the crystal orientation dependence of the doping characteristics of dopants in group III-V compound semiconductors grown by metal organic vapor phase epitaxy (MOVPE), by using dopants such as group II acceptors (Zn and Mg), group VI donors (Se), and group IV donors (Si). For details, reference may be made to Kondo, et al., "Crystal orientation dependence of impurity dopant incorporation in MOVPE-grown III-V materials", J. Crystal Growth, vol. 124, p.449, (1992), which is incorporated herein by reference.

SUMMARY OF THE INVENTION

It is an object of the present invention to provide a technique of manufacturing a novel semiconductor device by using a group III-V compound semiconductor substrate containing. As as a group V element and having a surface crystal orientation other than a (1 0 0) plane as well as a step, a groove, a ridge, or other uneven surface.

According to one aspect of the present invention, there is provided a method of manufacturing a semiconductor device including the steps of preparing a substrate made of group III-V compound semiconductor and having a flat surface exposing a (n 1 1)A plane (n is a real number of about $1 \leq n \leq$ about 3), epitaxially growing an n-type collector layer on the substrate, epitaxially growing a p-type base layer containing carbon as a p-type impurity on the collector layer, and epitaxially growing an n-type emitter layer on the base layer, the emitter layer being made of a material having a forbidden band width wider than that of the base layer.

According to another aspect of the present invention, there is provided a method of manufacturing a semiconductor device including the steps of preparing a substrate made of group III-V compound semiconductor and having a surface crystal orientation tilted by an angle in a range larger than 0° and equal to or smaller than 35° from a (1 0 0) plane to a (1 1 1)B plane or a surface crystal orientation tilted by an angle in a range larger than 0° and smaller than 25° from the (1 0 0) plane to a (1 1 1)A plane, epitaxially growing an electron transfer layer on the substrate without intentionally doping impurities, by using organic metal compound containing carbon as a group III source material or as a group V source material, and epitaxially growing an electron supply layer made of a material having a forbidden band width wider than that of the electron transfer layer.

According to still another aspect of the present invention, there is provided a method of manufacturing a semiconductor device including the steps of preparing a stepped substrate made of group III-V compound semiconductor and having a flat surface exposing a (1 0 0) plane and a slanted surface exposing an (n 1 1)B plane (n is a real number of about $1 \leq n$), or an (m 1 1)A plane (m is a real number of about $4 \leq m$), and epitaxially growing group III-V compound semiconductor on the stepped substrate by doping carbon as an impurity under the conditions that the grown epitaxial layer has an n-type region on the slanted surface and a p-type region on the flat surface.

According to a further aspect of the present invention, there is provided a method of manufacturing a semiconductor device including the steps of preparing a stepped substrate made of group III-V compound semiconductor and having a flat surface exposing a (1 0 0) plane and a slanted surface exposing a (n 1 1)B plane (n is a real number of about $1 \leq n$), and epitaxially growing group III-V compound semiconductor on the stepped substrate by doping carbon as an impurity and an n-type impurity at the same time or alternately under the conditions that the grown epitaxial layer has an n-type region on the slanted surface and a p-type region on the flat surface.

In this specification, the plane defined by using "about i" includes the plane defined by "i" and other planes tilted therefrom by +/−5°.

An epitaxial layer formed on a substrate exposing an (n 1 1)A plane (n is a real number of about $1 \leq n \leq 3$) incorporates more carbon as p-type impurities than on (1 0 0) plane. Therefore, by using a substrate exposing such a plane, an epitaxial layer having a high hole concentration can be formed easily. For example, a base layer of an HBT (hetero bipolar transistor) having a high hole concentration can be formed easily, so that the performance of HBT can be improved.

An epitaxial layer formed on a substrate exposing a crystal orientation plane tilted by an angle in the range larger than 0° and equal to or smaller than 35° from a (1 0 0) plane to a (1 1 1)B plane has a small incorporation probability of carbon than (1 0 0) plane. By using a substrate exposing such a plane with a small incorporation probability of carbon, an epitaxial layer of high purity and with less contamination of carbon can be grown. For example, it becomes easy to form a high purity electron transfer layer of a HEMT(high electron mobility transistor), so that the performance of HEMT can be improved.

A p-type or n-type epitaxial layer can be selectively formed depending upon the crystal orientation of the growth surface, by using a group III source material containing carbon and selecting a proper V/III ratio. A p-type region and an n-type region can be selectively formed and patterned in an epitaxial layer by using a substrate having a surface exposing a p-type forming plane and a surface exposing an n-type forming plane.

A p-type region and an n-type region can also be formed and patterned in an epitaxial layer depending upon the crystal orientation of the growth surface, even it carbon and Si are doped at the same time.

As described above, by selecting a proper crystal orientation, carbon can be doped in an epitaxial layer of group III-V compound semiconductor to a higher concentration than using a (1 0 0) plane, or conversely the incorporation or capture amount of carbon can be suppressed more than using the (1 0 0) plane. Therefore, high performance semiconductor devices such as HBT and HEMT can be manufactured.

Thus, it is possible to form a p- or n-type region in self-alignment with the configuration of a shaped substrate. It is therefore possible to form a semiconductor laser with a self-aligned current blocking region.

BRIEF DESCRIPTION OF THE DRAWINGS

FIG. 6 is a graph showing a crystal orientation dependence of a Si concentration and a carrier concentration in GaAs epitaxial layers formed by MOVPE.

DETAILED DESCRIPTION OF THE PREFERRED EMBODIMENTS

The crystal orientation dependence of the doping characteristics of impurities used by the first embodiment of the invention will be described first.

Figure 1:
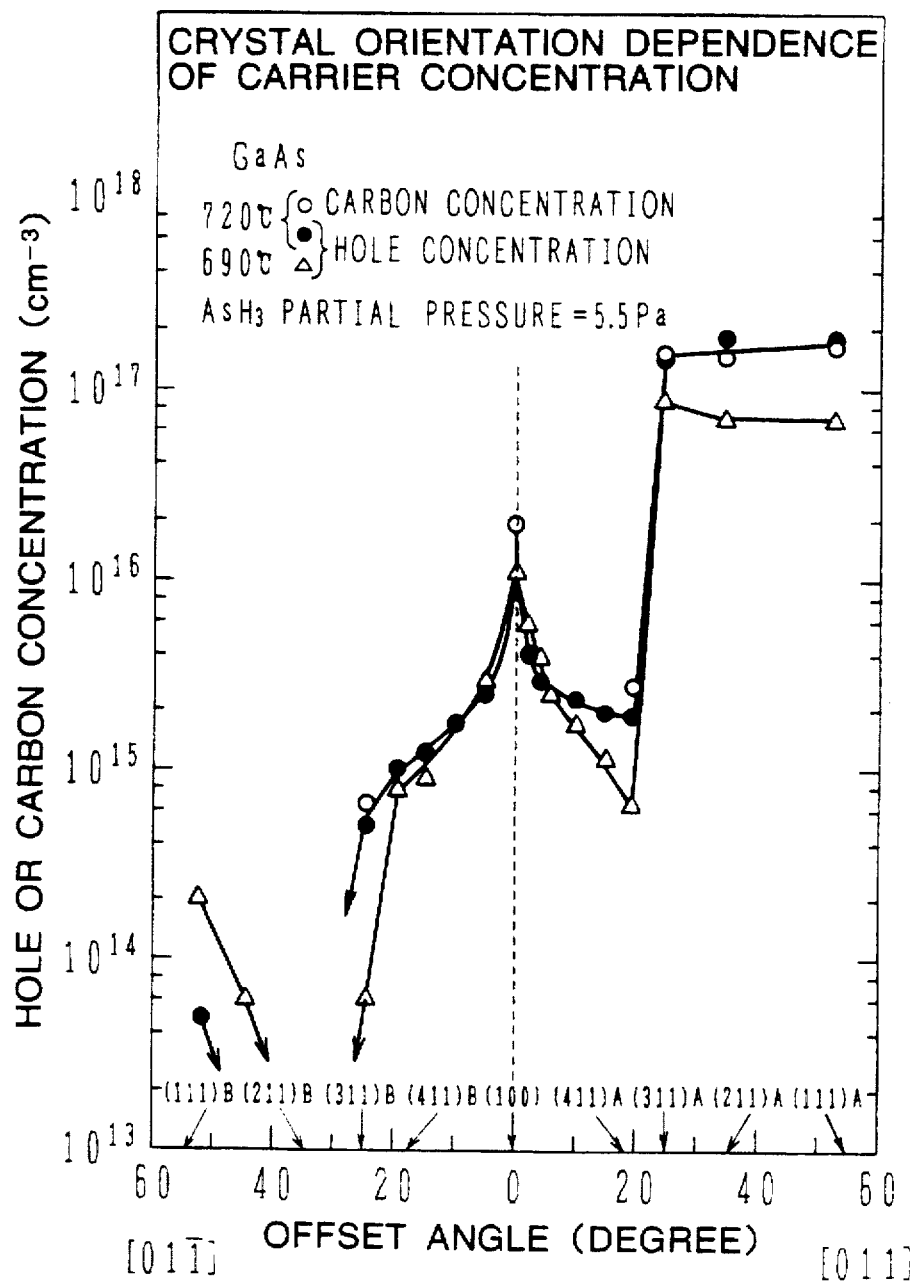
FIG. 1 is a graph showing a crystal orientation dependence of a carbon concentration and a carrier concentration in GaAs epitaxial layers formed by MOVPE.

FIG. 1 is a graph showing a crystal orientation dependence of a carbon concentration and a hole concentration of carbon-doped GaAs epitaxial layers grown by MOVPE. The abscissa represents an offset angle of the plane of a GaAs substrate from a (1 0 0) plane. The center of the abscissa is a (1 0 0) plane, the right side from the center shows an offset angle of the substrate tilted in the [0 1 1] direction, and the left side from the center shows an offset angle of the substrate tilted in the [0 1 $\bar{1}$] direction. That is to say, the right side half of FIG. 1 shows A planes, and the left side half shows B planes. Typical low Miller indices planes are also shown at respective corresponding offset angles in FIG. 1. The ordinate represents a carbon or a hole concentration in the unit of $cm^{-3}$.

Epitaxial layers were grown under a pressure of $6.6 \times 10^3$ Pa and an $AsH_3$ partial pressure of 5.5 Pa by using trimethyl gallium (TMGa) as the group III source material and arsine ($AsH^3$) as the group V shape material. In FIG. 1, an open circle symbol represents a carbon concentration and a solid circle symbol represents a hole concentration, respectively, in each epitaxial layer grown at a substrate temperature of 720° C. An open triangle symbol represents a hole concentration in each epitaxial layer grown at a substrate temperature of 690° C. The carbon concentration was measured by secondary ion mass spectrometry, and the hole concentration was measured from the C-V characteristic curve. Since both the measured values are generally equal, it can be understood that carbon atoms captured in the crystal are almost perfectly ionized (activated).

As seen from in FIG. 1, as the substrate surface is tilted in the [0 1 1] direction to the offset angle of about 20° i.e., in the range from the (1 0 0) plane to the (4 1 1)A plane, the hole concentration gradually lowers as the offset angle increases. As the offset angle is further increased toward about 25°, the (3 1 1)A plane, the hole concentration increases abruptly, about ten times as high as that at the (1 0 0) plane. The hole concentration scarcely changes as the offset angle is further increased from the (3 1 1)A plane.

As the substrate surface is tilted in the [0 1 $\bar{1}$] direction to the offset angle of about 25° i.e., in the range from the (1 0 0) plane to the (3 1 1)B plane, the hole concentration gradually lowers as the offset angle increases, similar to the A plane. The hole concentration takes a minimum value between the (3 1 1) B plane and the (2 1 1)B plane. As the offset angle is further increased, the hole concentration changes to have a higher value.

The crystal orientation dependence of a hole concentration has a similar tendency both at the substrate temperatures of 720° and 690°. The hole concentration and the carbon concentration are generally equal. The crystal orientation dependence of the hole concentration is therefore considered to reflect that of the carbon concentration. As seen from the above, the concentration of captured carbon atoms greatly depends upon the crystal orientation. The above experiments first revealed such complicated dependence.

Figure 2:
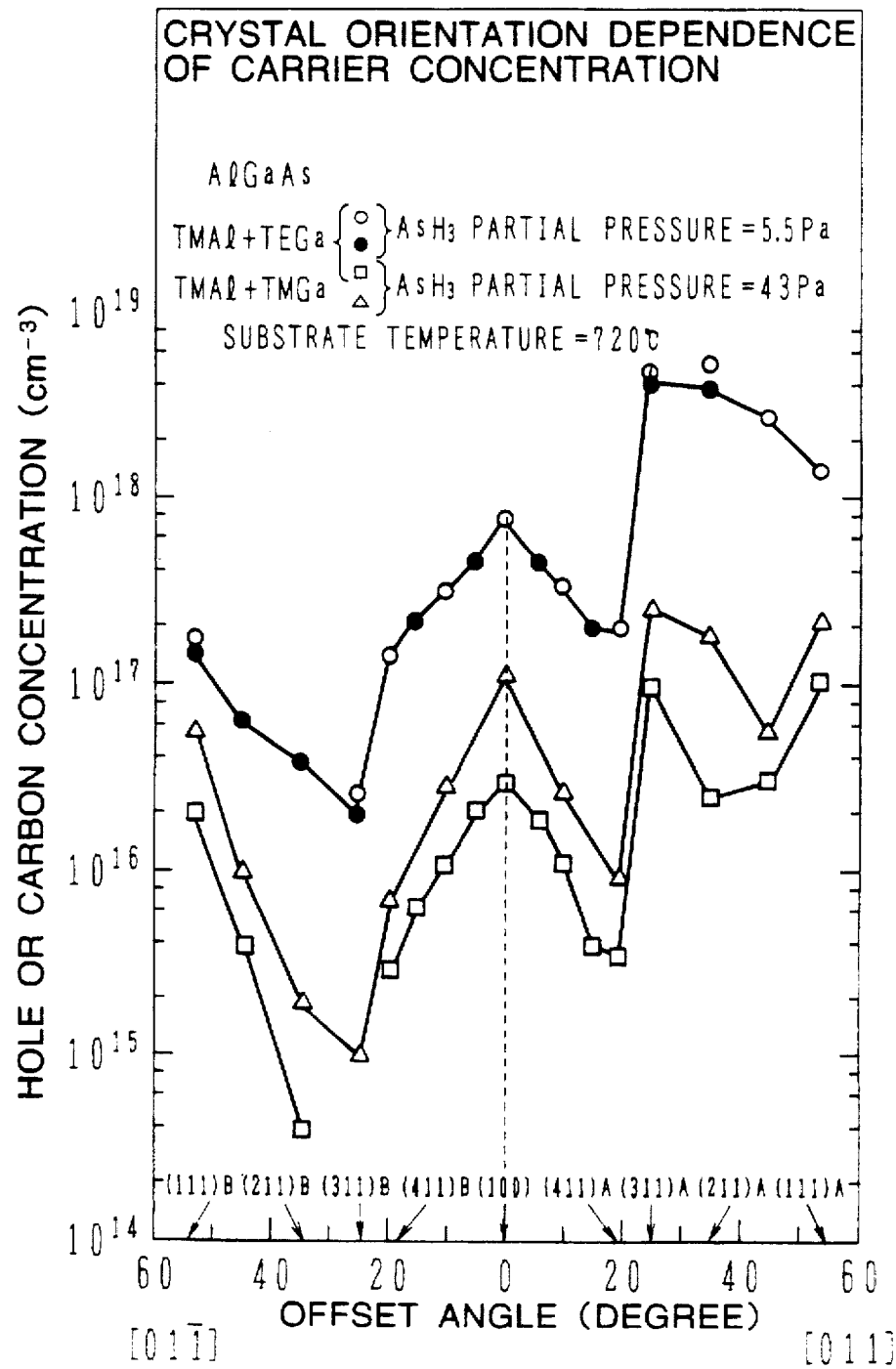
FIG. 2 is a graph showing a crystal orientation dependence of a carbon concentration and a carrier concentration in AlGaAs epitaxial layers formed by MOVPE.

FIG. 2 is a graph showing a crystal orientation dependence of a carbon concentration and a hole concentration of carbon-doped $Al_xGa_{1-x}As$ (x=0.3) epitaxial layers grown by MOVPE. Like FIG. 1, the abscissa and the ordinate represent an offset angle and the hole or carbon concentration.

Epitaxial layers were grown under a pressure of $6.6 \times 10^3$ Pa and a substrate temperature of 720° C. by using trimethyl aluminum (TMAl), and TMGa or triethyl gallium (TEGa) as the group III source material and arsine ($AsH_3$) as the group V source material. In FIG. 2, an open circle symbol represents a carbon concentration. A solid circle symbol, an open square symbol, and an open triangle symbol represent a hole concentration. Use of TEGa as the Ga source material pertains to the open circle symbol, solid circle symbol, and open square symbol, and use of TMGa as the Ga source material pertains to the open triangle symbol. An $AsH_3$ partial pressure of 5.5 Pa pertains to the open circle symbol and solid circle symbol, and that of 43 Pa pertains to the open square symbol and open triangle symbol.

Similar to FIG. 1, as the offset angle increased in the range from the (1 0 0) plane to the (4 1 1)A plane, the hole concentration gradually lowers. As the offset angle is further increased to about 25° C., the (3 1 1)A plane, the hole concentration increases abruptly.

As the substrate surface is tilted in the [0 1 $\bar{1}$] direction in the range from the (1 0 0) plane to the (3 1 1)B plane, the hole concentration gradually lowers as the offset angle increases. As the offset angle is further increased, the hole concentration changes to have a higher value.

A change in the hole concentration with the offset angle from the (1 0 0) plane of the substrate has a similar tendency both for TEGa and TMGa used as the Ga source material. A change in the hole concentration with the offset angle has a similar tendency both for the $AsH_3$ partial pressures of 5.5 Pa and 43 Pa, although the former pressure indicates a higher hole concentration than the latter pressure.

Such a crystal orientation dependence of a hole concentration can be used in manufacturing various types of semiconductor devices. For example, it can be seen that if p-type impurities are desired to be doped at a high concentration, it is preferable to use the plane in the range from the (3 1 1)A plane to the (1 1 1)A plane rather than to use the (1 0 0) plane. Conversely, if contamination by carbon impurities is desired to be suppressed as much as possible, it can be seen that it is more preferable to use the plane in the range from the (4 1 1)A plane to the plane near the (5 1 1)A plane or the plane in the range from the (3 1 1) B plane to the plane near the (2 1 1)B plane, than the (1 0 0) plane.

Figure 3A:
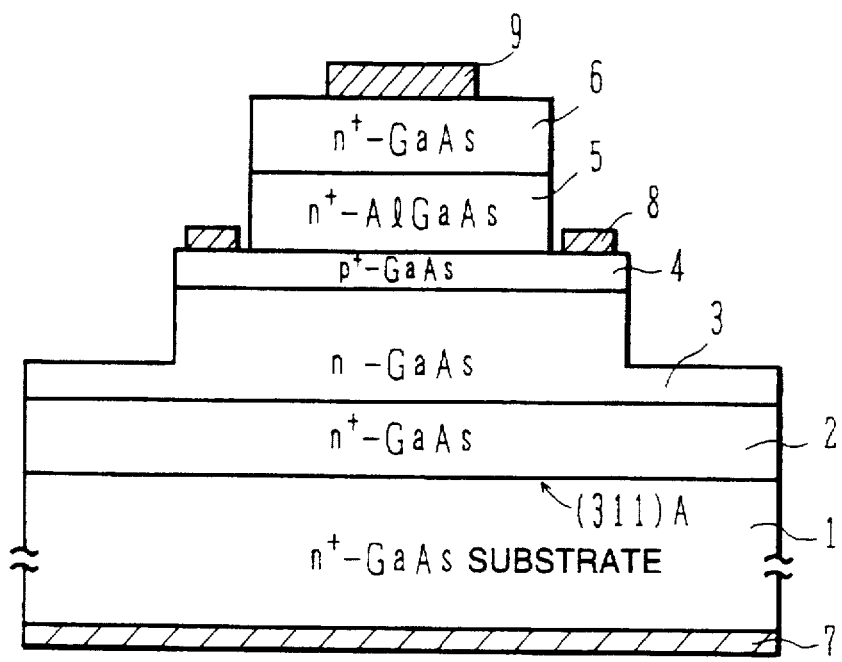
FIGS. 3A and 3B are cross sectional views of a HBT and an HEMT according to first and second embodiments of the invention.

FIG. 3A is a cross sectional view of the hetero bipolar transistor (HBT) according to the first embodiment of the invention. Being epitaxially formed on a Si-doped $n^+$-type GaAs substrate 1 having a (3 1 1)A plane are a Si-doped $n^+$-type GaAs buffer layer 2, a Si-doped n-type GaAs collector layer 3, a C-doped $p^+$-type GaAs base layer 4, a Si-doped n-type $Al_xGa_{1-x}As$ (e.g. x=0.3) emitter layer 5, and a Si-doped $n^+$-type GaAs cap layer 6.

Each layer was grown by MOVPE under the conditions of a growth temperature of 670° to 730° and a growth pressure of $6 \times 10^3$ to $1.0 \times 10^4$ Pa. TMAl was used as the Al source material, TMGa or TEGa was used as the Ga source material, $AsH_3$ was used as the As source material, hydrogen was used as a carrier gas, and a total gas flow was set to 8 l/min.

The electron concentration of the $n^+$-type GaAs substrate 1 was $4 \times 10^{18} cm^{-3}$. The electron concentration of the $n^+$-type GaAs buffer layer 2 was $4 \times 10^{18} cm^{-3}$ and the film thickness thereof was 1.0 µm. The electron concentration of the n-type GaAs collector layer 3 was $4 \times 10^{18} cm^{-3}$ and the film thickness thereof was 0.5 µm. The hole concentration of the $p^+$-type GaAs base layer 4 was $10^{18}$ to $10^{20}$ $cm^{-3}$ and the film thickness thereof was 0.01 to 0.1 µm. The electron concentration of the n-type $Al_xGa_{1-x}As$ emitter layer 5 was $1 \times 10^{18} cm^{-3}$ and the film thickness thereof was 0.5 µm. The electron concentration of the n-type GaAs cap layer 6 was $4 \times 10^{18} cm^{-3}$ and the film thickness thereof was 0.1 µm.

The $n^+$-type GaAs cap layer 6 and n-type AlGaAs emitter layer 5 are being selectively etched to leave a necessary emitter region and expose a partial surface of the $p^+$-type GaAs base layer 4. A base electrode 8 of AuZn is being formed on the exposed surface of the $p^+$-type GaAs base layer 4, and an emitter electrode 9 of AuGe is being formed on the surface of the unetched $n^+$-type GaAs cap layer 6.

The n-type GaAs collector layer 3 is being etched to the region near the outside edge of the base electrode 8, to form a second mesa structure. A collector electrode 7 of AuGe is formed on the lower surface of the $n^+$-type GaAs substrate.

An HBT is required to dope impurities in a very thin base region to a high concentration. It is therefore necessary to change a dope amount very sharply. By using the (3 1 1)A plane substrate, carbon atoms can be doped about ten times more than using a (1 0 0) substrate, as explained with FIG. 1. It is therefore possible to form a very thin, high impurity concentration base region with ease. A similar high carbon concentration can be achieved by using the (2 1 1)A plane or the (1 1 1)A plane in place of the (3 1 1)A plane.

Figure 3B:
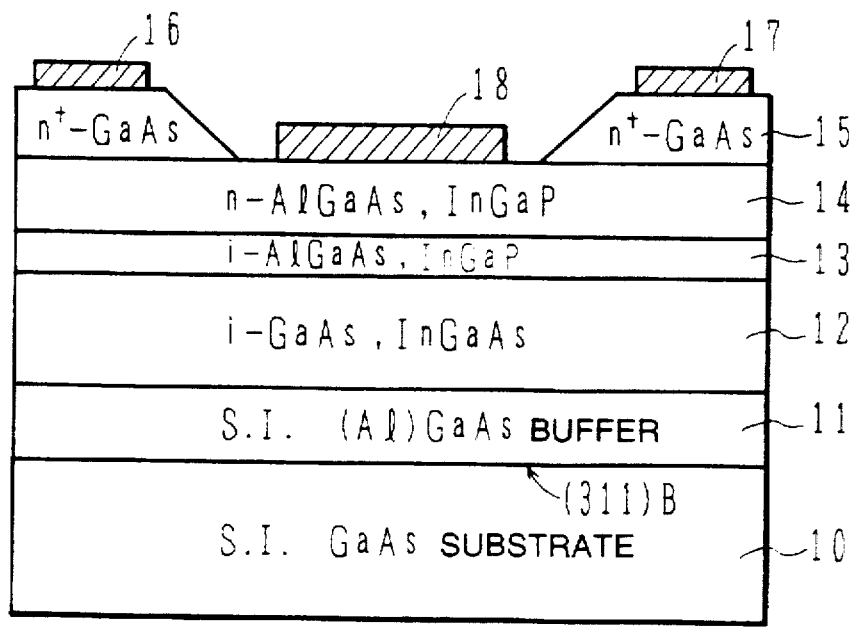

FIG. 3B is a cross sectional view of a high electron mobility transistor according to the second embodiment of the invention. Being epitaxially formed on an undoped or Cr-doped semi-insulating GaAs substrate 10 having a (3 1 1)B plane are a semi-insulating $Al_xGa_{1-x}As$ (e.g. x=0.3) or GaAs buffer layer 11, an undoped GaAs electron transfer layer 12, an undoped $Al_xGa_{1-x}As$ (e.g. x=0.3) or $In_xGa_{1-x}P$ (e.g. x=0.5) spacer layer 13, a Si- or Se-doped n-type $Al_xGa_{1-x}As$ (e.g. x=0.3) or $In_xGa_{1-x}P$ (e.g. x=0.5) electron supply layer 14, and a Si-doped $n^+$-type GaAs contact layer 15. Each layer is grown under the same conditions described with FIG. 3A.

The $n^+$-type GaAs contact layer 15 is selectively etched to form an opening whose bottom exposes the surface of the electron supply layer 14. A Schottky contact gate electrode 18 of Al is formed on the exposed surface of the electron supply layer 14. A source electrode 16 and a drain electrode 17, both of AuGe, respectively in contact with the $n^+$-type GaAs contact layer 15 are formed on the surface of the contact layer 15 left on both sides of the opening.

A HEMT is required to have an electron transfer layer of high purity, i.e. with less residual impurities, in order to make an electron mobility as high as possible and to suppress the side gate effects in an integrated device. Main residual impurities in an GaAs layer formed by MOVPE are C or Si. By using a substrate having a (3 1 1)B plane, it is possible to suppress the dope amount of C into the GaAs layer so that an electron transfer layer of higher purity than using a (1 0 0) plane can be formed.

As seen from FIG. 1, use of a substrate having a crystal orientation tilted from the (1 0 0) plane toward the (1 1 1)B plane allows to suppress the dope amount of C more than using the (1 0 0) plane. When the offset angle from the (1 0 0) plane is about 35° or larger, the surface conditions of the substrate become bad. It is therefore preferable to set the offset angle to 35° or smaller. The plane, such as a (4 1 1)A plane, tilted by an angle in the range larger than 0° and smaller than 25°, from the (1 0 0) plane to the (1 1 1)A plane, may also be used which has a small carbon capture amount. Material containing As such as InGaAs may be used for the electron transfer layer, with similar advantageous effects being ensured by a proper selection of crystal orientation.

Next, the principles of the third to sixth embodiments will be explained with reference to FIGS. 4 to 10.

Figure 4:
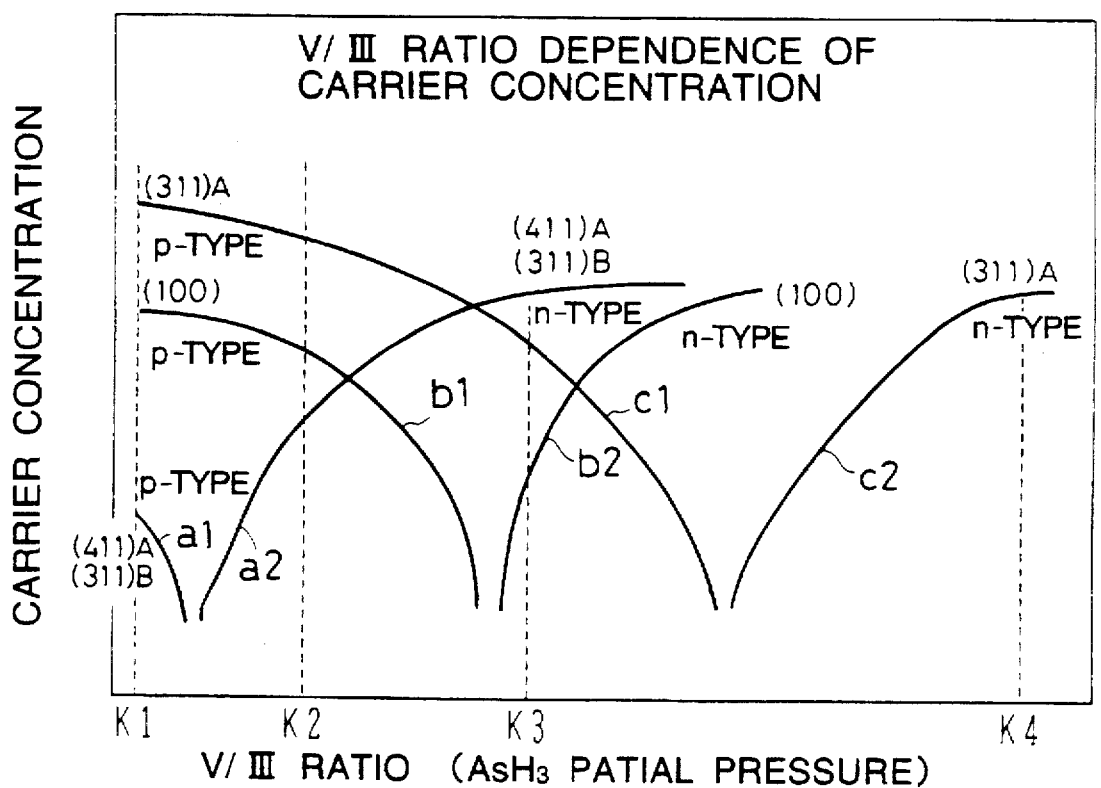
FIG. 4 is a graph showing a V/III ratio dependence of a carrier concentration in GaAs epitaxial layers formed by MOVPE.

FIG. 4 is a graph showing a change in a carrier concentration in a C-doped GaAs layer formed by MOVPE relative to a V/III ratio or an AsH$_3$, partial pressure. The abscissa represents a V/III ratio or AsH, partial pressure in an arbitrary scale. The ordinate represents a carrier concentration in an arbitrary scale.

Curves a1, b1, and c1 represent hole concentrations in C-doped GaAs layers formed on substrates respectively having a (3 1 1)B plane or a (4 1 1)A plane, a (1 0 0) plane, and a (3 1 1)A plane. Curves a2, b2, and c2 represent electron concentrations.

As shown in FIG. 4, as the V/III ratio increases, the capture of carbon elements is suppressed and the hole concentration reduces irrespective of the crystal orientation of a substrate. At a certain V/III ratio, the conductivity type is inverted from the p-type to the n-type and the electron concentration increases. The V/III ratio at which the p-type is inverted to the n-type changes with the crystal orientation of a substrate.

The V/III ratio at which the p-type is inverted to the n-type becomes Large in the order of the (3 1 1)B plane or (4 1 1)A plane, the (1 0 0) plane, and the (3 1 1)A plane. By utilizing the characteristics that the V/III ratio at which the p-type is inverted to the n-type changes with the crystal orientation, it becomes possible to pattern and form a p-type region or regions and an n-type region or regions by the same film forming process on a substrate having a plurality of surfaces of different planes of crystal orientation. In the following, an example of patterning a p-type region and an n-type region on a substrate by utilizing such characteristics will be described.

Figure 5A:
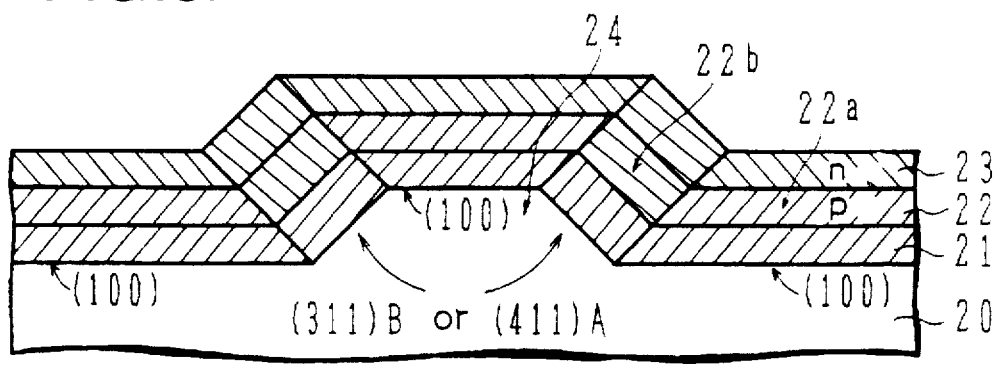
FIGS. 5A to 5C are (ross sectional views of substrates illustrating the selective formation of n-type and p-type regions by positively using a different V/III ratio dependence of a carrier concentration on crystal orientation.

As shown in FIG. 5A, on a GaAs substrate 20 having a (1 0 0) plane, a ridge 24 is being formed which has a flat surface of the (1 0 0) plane and slanted surfaces of a (3 1 1)B plane, a (4 1 1)A plane, or another plane having a carbon capture amount smaller than the (1 0 0) plane.

The ridge 24 may be formed by wet etching using a resist mask. The slanted surface formed by wet etching is not a surface having a single crystal orientation but contains other surfaces near the (3 1 1)B plane or (4 1 1)A plane. These surfaces are considered to have similar function as the (3 1 1)B plane or (4 1 1)A plane. In the following, although the flat surface and slanted surfaces are each described to have a single crystal orientation, it is intended that they may have other crystal orientations conceivable to have similar functions.

As an epitaxial growth is performed first under the condition of the V/III ratio of K1 shown in FIG. 4, a p-type epitaxial layer 21 is formed on the whole surface of a substrate 20. Next, as an epitaxial growth is performed by increasing the V/III ratio to K2, an epitaxial layer 22 is formed which has a p-type region on the flat surface of the (1 0 0) plane and an n-type region on the slanted surface of the (3 1 1)B plane or (4 1 1)A plane. Therefore, an epitaxial layer having a stripe-shaped n-type region 22b between p-type regions 22a can be formed by the single film forming process.

As an epitaxial growth is performed by further increasing the V/III ratio to K4, an n-type epitaxial layer 23 is formed on the whole surface of the substrate. The p-type epitaxial layer 21 grown under the condition of the V/III ratio of K1 has different hole concentrations at the region under the flat surface and the regions under the slanted surface, the hole concentration under the flat surface being higher than that under the slanted surface.

In FIG. 5A, the slanted surface having the (3 1 1)B plane or (4 1 1)A plane is used. The slanted surface having an (n 1 1)B plane (n is a real number of about 1≦n) or a (m 1 1)A plane (m is a real number of about 4=m) may be used.

Figure 5B:
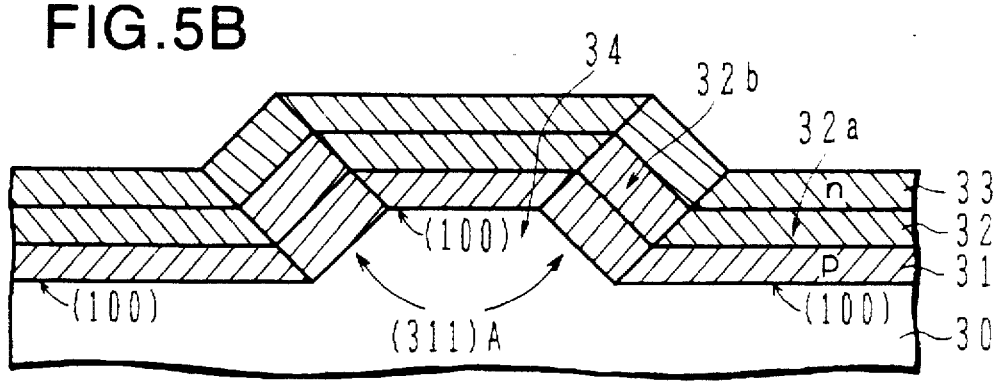

FIG. 5B shows a semiconductor device having a ridge with the slanted surface of a (3 1 1)A plane.

As shown in FIG. 5B, on a GaAs substrate 30 having a (1 0 0) plane, a ridge 34 is being formed which has a flat surface of the (1 0 0) plane and slanted surfaces of a plane such as a (3 1 1)A plane having a carbon capture amount larger than the (1 0 0) plane.

As an epitaxial growth is performed first under the condition of the V/III ratio of K1 or K2 shown in FIG. 4, a p-type epitaxial layer 31 is formed on the whole surface of a substrate 30. Next, as an epitaxial growth is performed by increasing the V/III ratio to K3, an epitaxial layer 32 is formed which has an n-type region on the flat surface of the (1 0 0) plane and a p-type region on the slanted surface of the (3 1 1)A plane. Therefore, an epitaxial layer having a stripe-shaped p-type region 32b between n-type regions 32a can be formed by the single film forming process. As an epitaxial growth is performed by further increasing the V/III ratio to K4, an n-type epitaxial layer 33 is formed on the whole surface of the substrate.

Figure 5C:
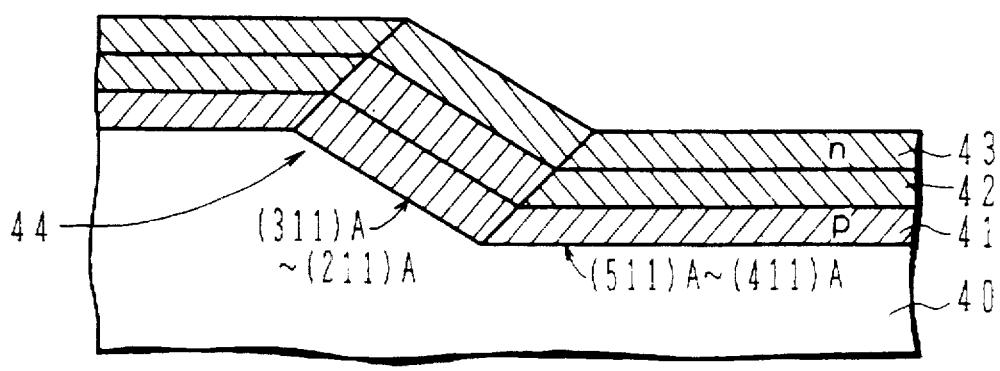

FIG. 5C shows a semiconductor device having C-doped layers formed on a substrate 40 having flat surfaces exposing a plane in the range from a (5 1 1)A plane to a (4 1 1)A plane and a slanted surface exposing a plane in the range from a (3 1 1)A plane to a (2 1 1)A plane.

As an epitaxial growth is performed first under the condition of the V/III ratio of K1 shown in FIG. 4, a p-type epitaxial layer 41 is formed on the whole surface of a substrate 40. Next, as an epitaxial growth is performed by increasing the V/III ratio to K2 or K3, an epitaxial layer 42 is formed which has n-type regions on the flat surfaces and a p-type region on the slanted surface. Therefore, an epitaxial layer having a stripe-shaped p-type region between n-type regions can be formed by the single film forming process. As an epitaxial growth is performed by further increasing the V/III ratio to K4, an n-type epitaxial layer 43 is formed on the whole surface of the substrate.

In the above embodiments, a GaAs layer is epitaxially grown. Instead of a GaAs layer, other group III-V compound semiconductor Layers such as AlGaAs may be used so long as they contain As as the group V element. Also in such a case, a layer having n-type and p-type regions can be patterned by using different planes of crystal orientation.

The flat surface may have a plane in the range from a (1 1 1)A plane to a (3 1 1)A plane which has a carbon capture amount at least approximately equal to or larger than that of a (1 0 0) plane. The slanted surface may have an(n 1 1)A plane (n is a real number of about 4≦n) having a carbon capture amount smaller than that of the (1 1 1)A plane to the (3 1 1)A plane.

In the above embodiments, carbon elements are doped by using organic metal containing carbon as the group III source material. A doping source of only carbon may be used by changing the dope amount thereof, with similar advantageous effects described above. Furthermore, in the above embodiments, a ridge of a simple shape is used. Instead, a ridge, a groove, a step, or the like of a desired shape may be used to pattern p-and n-type regions of the desired shape.

Next, the principle of patterning p- and n-type regions not by doping only carbon elements but by doping carbon and other element or elements will be described.

FIG. 6 is a graph showing a crystal orientation dependence of a Si concentration in a Si-doped GaAs layer formed by MOVPE. The growth temperature of GaAs layers was 670° C. and the doping gas used was disilane ($Si_2H_6$). Similar to FIG. 1, the abscissa represents an offset angle from a (1 0 0) plane, the right half of FIG. 6 represents the A plane, and the left half thereof represents the B plane. The ordinate represents a carrier or Si concentration in an arbitrary scale. An open circle symbol indicates a Si concentration and a solid circle symbol indicates a carrier concentration.

As shown in FIG. 6, the silicon concentration and the carrier concentration are generally equal, and scarcely depend on the crystal orientation of a substrate. Even if monosilane ($SiH_4$) is used as the doping gas, Si doping can be performed with a crystal orientation dependence considerably smaller than carbon, although there is a crystal orientation dependence more or less as compared to disilane.

Figure 7:
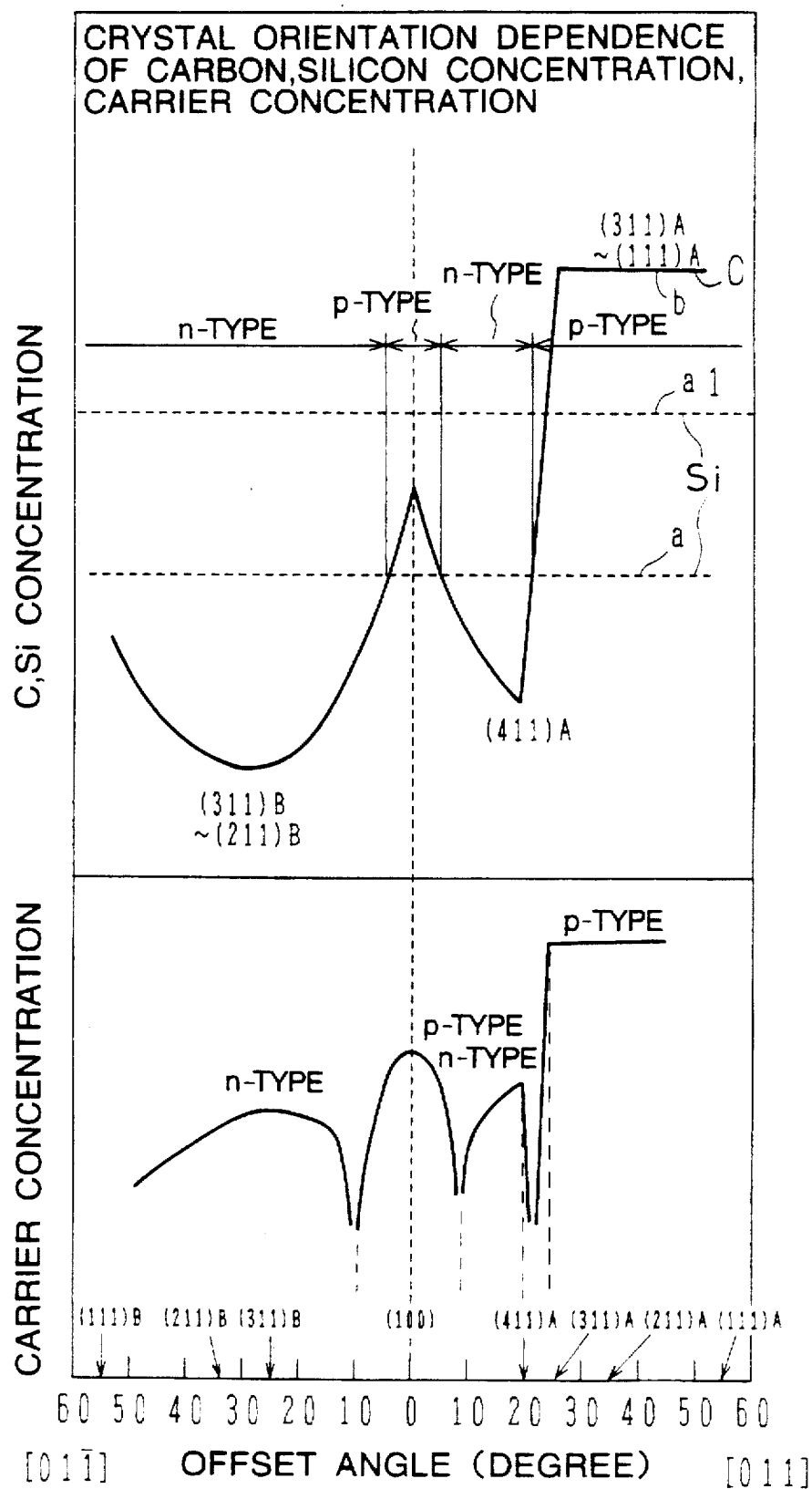
FIG. 7 is a graph showing a crystal orientation dependence of a carbon concentration, a Si concentration, and a carrier concentration in GaAs epitaxial layers formed by MOVPE.

The upper diagram in FIG. 7 is formed by superposing FIG. 1 of the carbon concentration upon FIG. 6 of the silicon concentration. A curve b indicates the C concentration and broken lines a and a1 indicate the Si concentration. The broken line a stands for an epitaxial growth under the conditions that the Si dope amount is smaller than the C dope amount at the (1 0 0) plane and larger than the C dope amount at the (4 1 1)A plane. The broken line a1 stands for an epitaxial growth under the conditions that the Si dope amount is larger than the C dope amount at the (1 0 0) plane and smaller than the C dope amount at the (3 1 1)A plane.

The lower diagram in FIG. 7 shows a crystal orientation dependence of a carrier concentration when both C and Si are doped under the Si doping conditions of the broken line a. Si becomes an n-type impurity by substituting a group III element, and C becomes a p-type impurity by substituting a group V element. Therefore, a layer grown on the surface of a substrate having a plane near a (1 0 0) plane becomes a p-type because the C dope amount is lager than the Si dope amount.

As the offset angle of a substrate departs from the (1 0 0) plane, the C dope amount reduces and becomes near the Si dope amount. The hole concentration therefore reduces. As the offset angle further increases, the C dope amount becomes smaller than the Si dope amount. As a result, electrons become the majority carrier and the conductivity type becomes an n-type.

As the offset angle increases in the [0 1 1 1] direction to reach the (4 1 1)A plane, the C concentration reduces more and the electron concentration increases. As the offset angle increases to the (3 1 1)A plane, the C concentration increases abruptly and becomes equal to or more than the Si concentration. Therefore, the conductivity type becomes again a p-type, and the hole concentration becomes higher than that in the layer formed on the (1 0 0) plane.

As the offset angle increases in the [0 1 $\bar{1}$] direction, the C concentration gradually reduces and takes a minimum value at the plane between the (3 1 1)B plane and the (2 1 1)B plane. Therefore, as the offset angle increases, the electron concentration gradually increases and takes a maximum value at the plane between the (3 1 1)B plane and the (2 1 1)B plane.

By doping C and Si under the proper doping conditions, it becomes therefore possible to control the conductivity type and the carrier concentration of an epitaxial layer in accordance with the crystal orientation of the substrate. It is therefore possible to epittaxially grow p- and n-type regions by doping both Si and C at the same time in a layer on the substrate having partial surfaces of different crystal orientations.

Figure 8A:
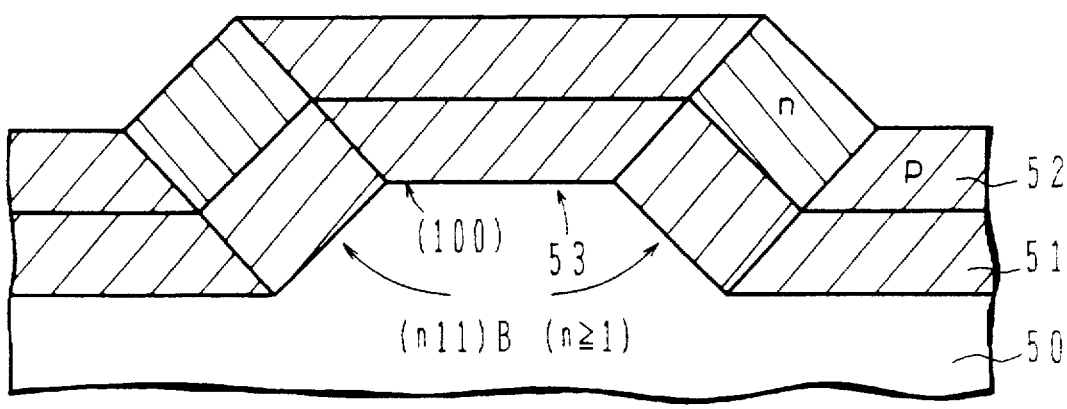
FIGS. 8A to 8C are cross sectional views of substrates illustrating the selective formation of n-type and p-type regions by positively using different crystal orientation dependence between a carbon concentration and a Si concentration.
Figure 8B:
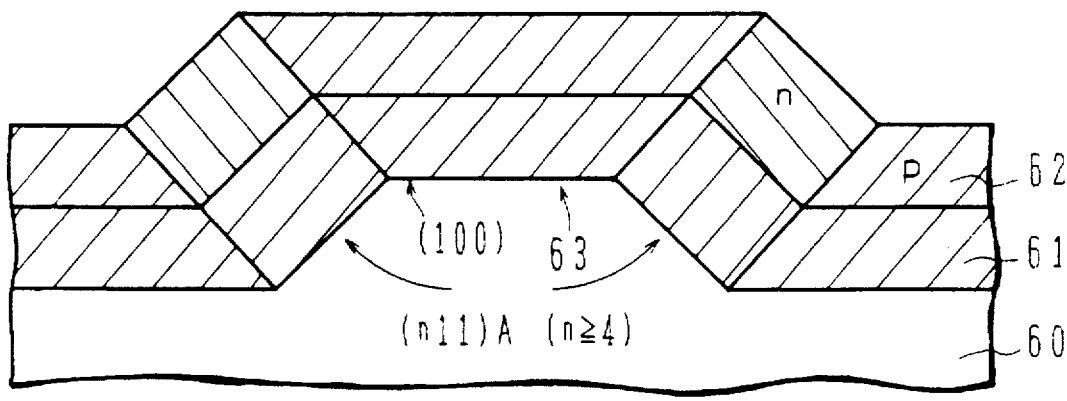
Figure 8C:
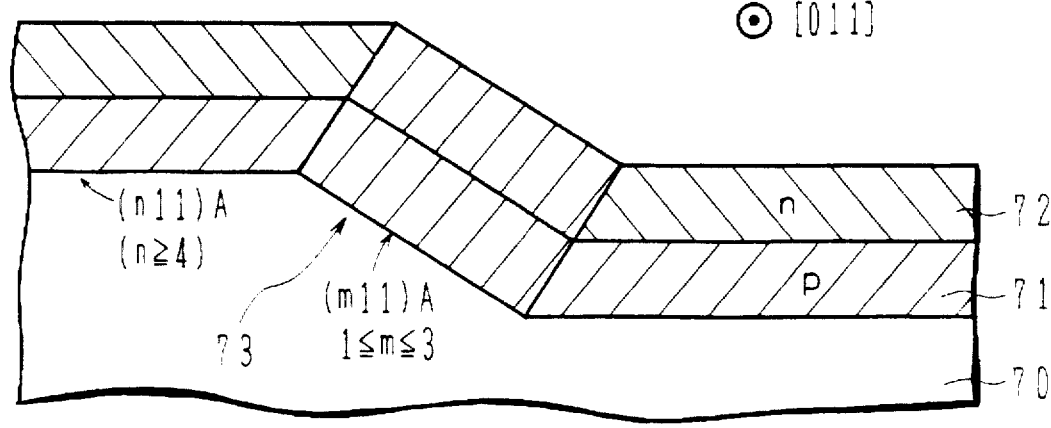

FIGS. 8A to 8C show examples of semiconductor devices having p- and n-type regions on the surfaces of substrates selectively formed by doping C and Si at the same time.

FIG. 8A shows an example utilizing the characteristics that a p-type region is formed on the surface having a plane near a (1 0 0) plane and an n-type region is formed on the surface having a plane near an (n 1 1)B plane (n is a real number of about $1 \leq n$). On the surface of a substrate 50 having the (1 0 0) plane, a ridge 53 is being formed having slanted surfaces of the (n 1 1)B plane (n is a real number of about $1 \leq n$) And extending in the [0 $\bar{1}$ $\bar{1}$] direction. First, a p-type epitaxial layer 51 is formed on the whole surface of the substrate 50 by doping only C. The region under the slanted surface of the epitaxial layer 51 has a hole concentration smaller than the region under the flat surface, because of a smaller C capture amount.

Next, both C and Si are doped at the same time under the conditions indicated by the broken line a shown in the upper drawing of FIG. 7. The region under the slanted surface has an n-type conductivity as seen from the Lower drawing of FIG. 7. Therefore, an epitaxial layer 52 is formed having a p-type region under the flat surface and an n-type region under the slanted surface.

FIG. 8B shows an example utilizing the characteristics that a p-type region is formed on the surface having a plane near a (1 0 0) plane and an n-type region is formed on the surface having a plane near a (n 1 1)A plane (n is a real number of about $4 \leq n$). On the surface of a substrate 60 having the (1 0 0) plane, a ridge 63 is being formed having slanted surfaces of the (n 1 1)A plane (n is a real number of about $4 \leq n$) and extending in the [0 1 $\bar{1}$] direction. First, a p-type epitaxial layer 61 is formed on the whole surface of the substrate 60 by doping only C. Next, by doping both C and Si at the same time, an epitaxial layer 62 is formed having a p-type region under the flat surface and an n-type region under the slanted surface.

FIG. 8C shows an example utilizing the characteristics that an n-type region is formed on the surface having a (n 1 1)A plane (n is a real number of about 4<n) and a p-type region is formed on the surface having a (m 1 1)A plane (m is a real number of about $1 \leq m \leq$ about 3). On the surface of a substrate 70 having the (n 1 1)A plane (n is a real number of about $4 \leq n$) on its main surface, a step 73 is being formed having a slanted surface of the (m 1 1)A plane (m is a real number of 1 about $1 \leq m \leq$ about 3) and extending in the [0 1 $\bar{1}$] direction. First, a p-type epitaxial layer 71 is formed on the whole surface of the substrate 70 by doping only C. Next, by doping both C and Si at the same time, an epitaxial layer 72 is formed having an n-type region under the flat surface and a p-type region under the slanted surface.

Si is used as the n-type impurity in the cases shown in FIG. 6 and 7 and FIGS. 8A to 8C. Other elements may be used as the n-type impurity.

Figure 9:
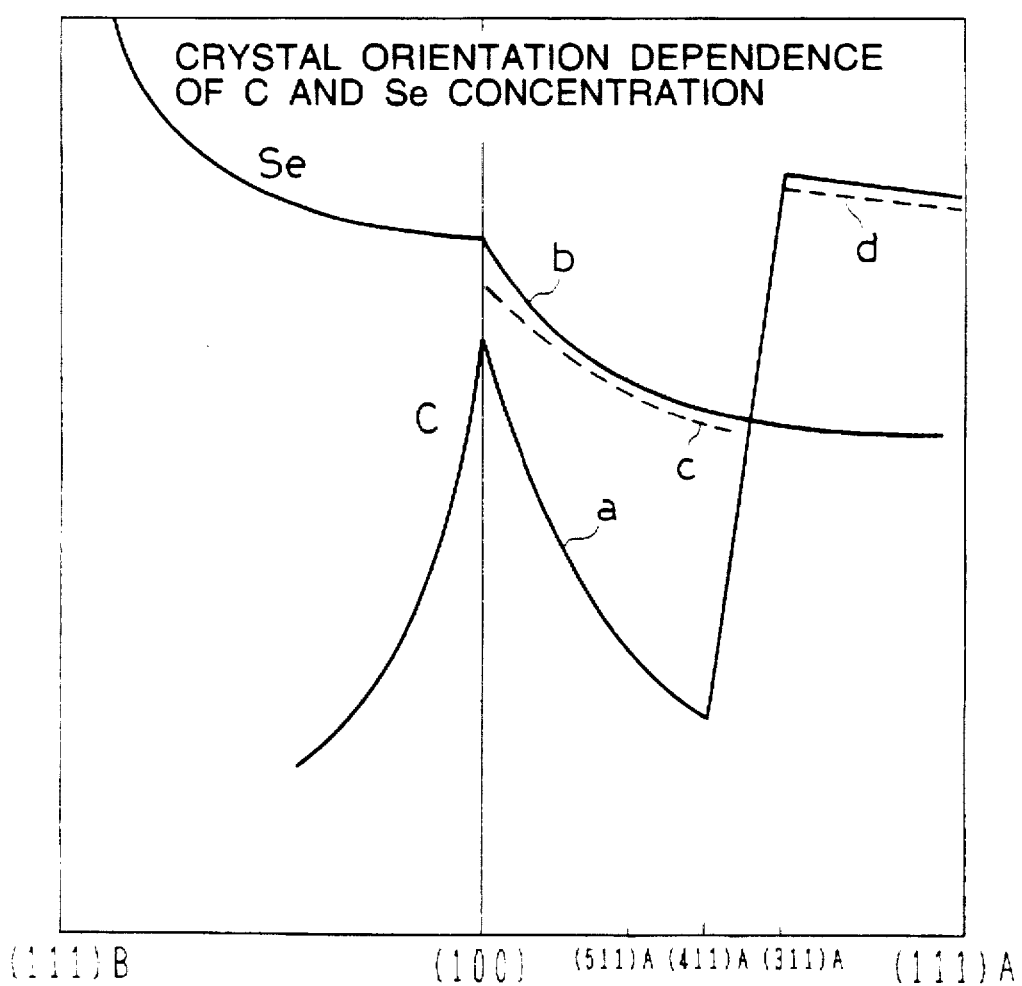
FIG. 9 is a graph showing a crystal orientation dependence of a carbon concentration, a Se concentration, and a carrier concentration in GaAs epitaxial layers formed by MOVPE.

FIG. 9 is a graph showing a crystal orientation dependence of an impurity concentration in a (GaAs layer epitaxially grown by using Se as an n-type impurity. The abscissa represents a crystal orientation, and the ordinate represents an impurity concentration and a carrier concentration in an arbitrary scale. A curve a indicates a C concentration, and a curve b indicates a Se concentration. The crystal orientation dependence of the C concentration is the same as that shown in FIG. 1. The Se concentration gradually reduces as the plane is tilted from the (1 0 0) plane to the (1 1 1)A plane. The epitaxial growth was performed under the conditions that the Se concentration is higher than the C concentration at the (1 0 0) plane and (4 1 1)A plane and that the C concentration is higher than the Se concentration at the (3 1 1)A plane.

Under the conditions shown in FIG. 9, the Se concentration is higher than the C concentration in the range from the (1 0 0) plane to the (4 1 1)A plane, and the conductivity type of an epitaxial layer becomes an n-type. The C concentration is higher than the Se concentration in the range from the (3 1 1)A plane to the (1 1 1)A plane, and the conductivity type of an epitaxial layer becomes a p-type. Therefore, the electron concentration gradually reduces as indicated by a curve c as the plane is tilted from the (1 0 0) plane to the (4 1 1)A plane. The hole concentration is nearly constant as indicated by a curved in the range from the (3 1 1)A plane to the (1 1 1)A plane.

Figure 10A:
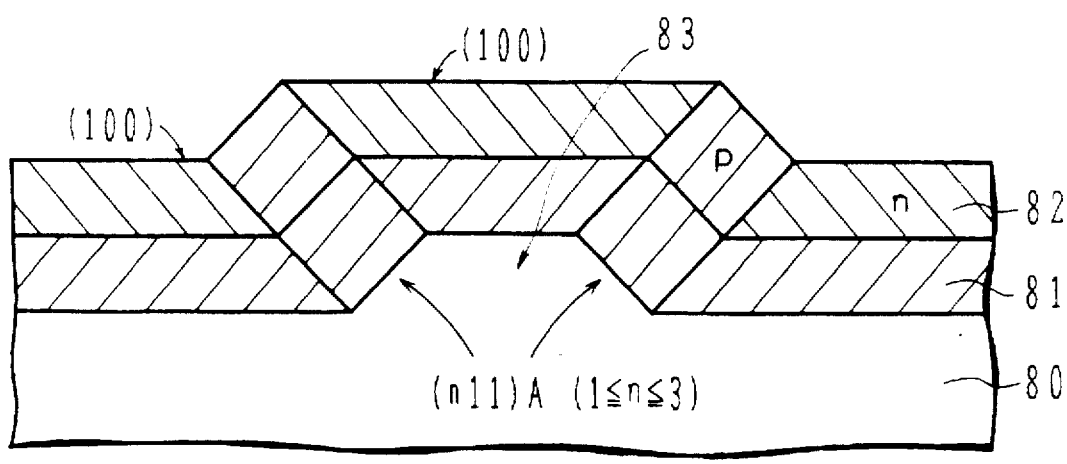
FIGS. 10A and 10B are cross sectional views of substrates illustrating the selective formation of n-type and p-type regions by positively using different crystal orientation dependence between a carbon concentration and an Se concentration.
Figure 10B:
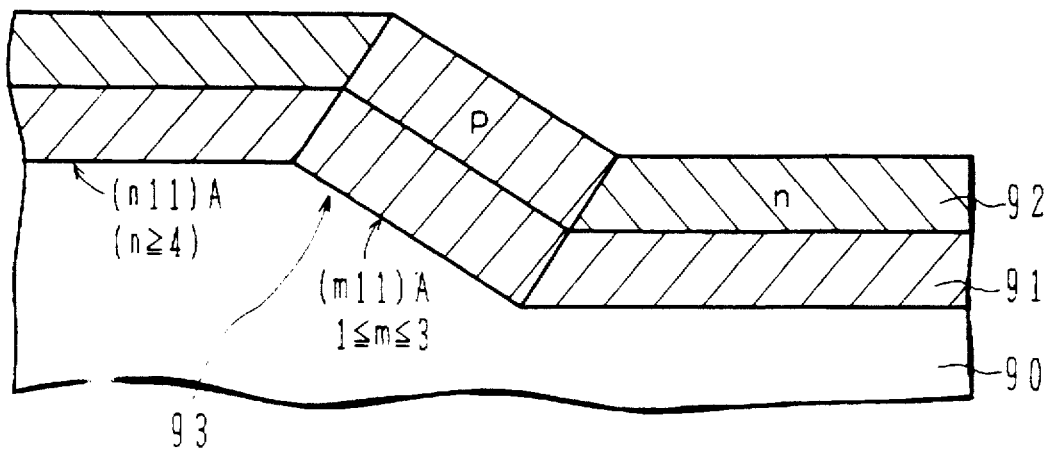

FIGS. 10A and 10B show examples of semiconductor devices having p- and n-type regions in an epitaxial layer selectively formed by doping both C and Se at the same time.

FIG. 10A shows an example utilizing the characteristics that an n-type region is formed on the surface having a (1 0 0) plane and a p-type region is formed on the surface having a plane in the range from a (3 1 1)A plane to a (1 1 1)A plane. On the surface of a substrate 80 having the (1 0 0) plane, a ridge 83 is being formed having slanted surfaces of a (n 1 1)A plane (n is a real number of about $1 \leq n \leq$ about 3). First, a p-type epitaxial layer 81 is formed on the whole surface of the substrate 80 by doping only C. Next, both C and Se are doped at the same time to epitaxially grow an epitaxial layer 82 having an n-type region under the flat surface and a p-type region under the slanted surface.

FIG. 10B shows an example utilizing the characteristics that an n-type region is formed on the surface having a (n 1 1)A plane (n is a real number of about $4 \leq n$) and a p-type region is formed on the surface having a plane in the range from a (3 1 1)A plane to a (1 1 1)A plane. On the surface of a substrate 90 having the (n 1 1) plane (n is a real number of about $4 \leq n$) on its main surface, a step 93 is being formed having a slanted surface of a (m 1 1)A plane (m is a real number of about $1 \leq m \leq$ about 3). First, a p-type epitaxial layer 91 is formed on the whole surface of the substrate 90 by doping only C. Next, both C and Se are doped at the same time to grow an epitaxial layer 92 having an n-type region under the flat surface and a p-type region under the slanted surface.

By doping C and Se under the proper conditions, an n-type region and a p-type region can be selectively formed. In FIG. 9 and FIGS. 10A and 10B, Se is used as the n-type impurity. Other group VI elements such as S may also be used with similar advantageous effects.

Another embodiment will be described in which a semiconductor laser radiating a laser beam of 0.78 to 0.98 μm wavelength is formed by utilizing a dependence of a C capture amount upon a V/III ratio and crystal orientation and a difference of a crystal orientation dependence of a capture amount between impurities such as C, Si, and Se.

Figure 11:
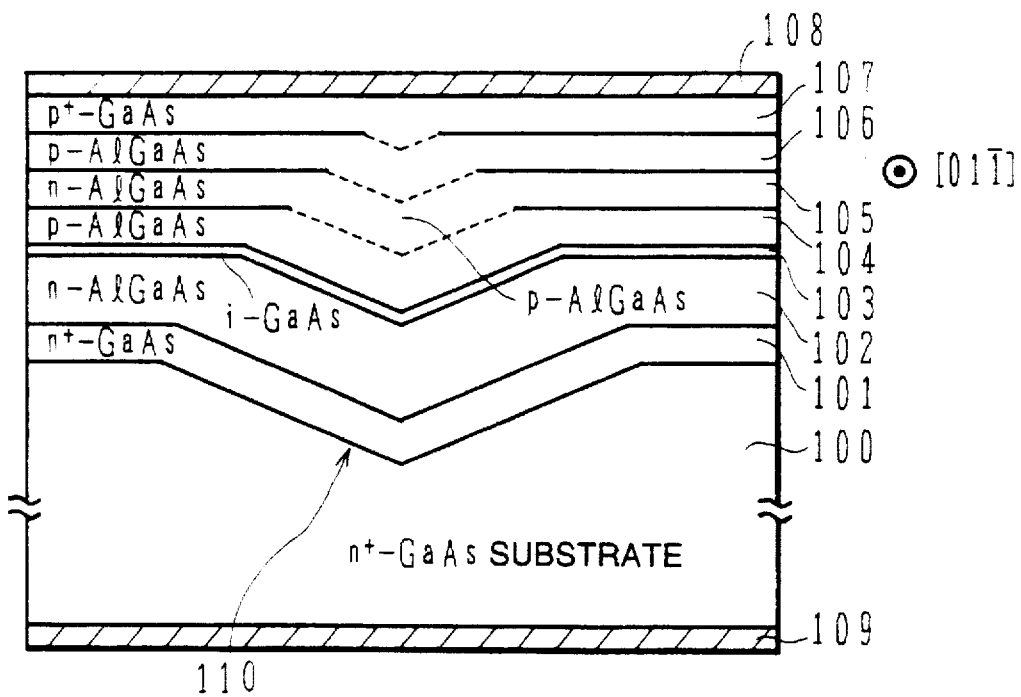
FIG. 11 is a cross sectional view of a semiconductor laser according to a third embodiment of the invention.

FIG. 11 is a cross sectional view of a semiconductor laser according to the third embodiment of the invention. The semiconductor laser of the third embodiment is formed by utilizing a difference of an impurity capture amount between a (1 0 0) plane and a (3 1 1)A plane. On the surface of an n⁺-type GaAs substrate 100 having the (1 0 0) plane on its main surface, a groove 110 of a V-shape is being formed having slanted surfaces of generally the (3 1 1) A plane and extending in the [0 1 $\bar{1}$] direction. Si is (loped as the n-type impurity in the GaAs substrate 100 to an impurity concentration of $4 \times 10^{18} \text{cm}^{-3}$.

On the n⁺-type GaAs substrate 100, an n⁺-type GaAs buffer layer 101 is being formed to a thickness of about 1.0 μm. Si is being doped as the n-type impurity in the GaAs buffer layer 101 to an impurity concentration of $1 \times 10^{18} \text{cm}^{-3}$.

On the n⁺-type GaAs buffer layer 101, an n-type $Al_xGa_{1-x}As$ clad layer (e.g. x=0.3) 102 is being formed to a thickness of about 2.0 μm. Si is being doped as the n-type impurity in the AlGaAs clad layer 102 to an impurity concentration of $5 \times 10^{17} \text{cm}^{-3}$.

On the n-type clad layer 102, an undoped GaAs or $Al_xGa_{1-x}As$ (e.g. x≈0.1) active layer or a GaAs/$In_xGa_{1-x}As$/GaAs (e.g. x≈0.2) strained quantum well active layer 103 is being formed.

On the active layer 103, a p-type $Al_xGa_{1-x}As$ clad layer (e.g. x=0.3) 104 is being formed to a thickness of about 0.2 μm. C is being doped as the p-type impurity in the AlGaAs clad layer 104 to an impurity concentration of $1 \times 10^{18} \text{cm}^{-3}$.

On the p-type AlGaAs clad layer 104, a current blocking or confining $Al_xGa_{1-x}As$ (e.g. x=0.3) layer 105 is being formed to a thickness of about 0.2 μm. The current confining layer 105 is formed by setting a proper V/III ratio shown in FIG. 4 or by doping both C and Si at the same time as shown in FIG. 7.

If the current confining layer 105 is to be formed by setting a proper V/III ratio, the V/III ratio, shown in FIG. 4 is set to K3. Under the condition of the V/IIII ratio of K3, the epitaxial layer has an n-type region at the (1 0 0) plane and a p-type region at the (3 1 1)A plane. Therefore, the current confining layer 105 shown in FIG. 11 has a p-type region under the flat surface and an n-type region under the slanted surface.

If the current confining layer 105 is to be formed by doping both C and Si at the same time, the layer 105 is grown under the conditions that the Si concentration is set to the broken line a1 in the upper drawing of FIG. 7. An n-type region is formed at the (1 0 0) plane because the Si concentration is higher than the C concentration, and a p-type region is formed at the (3 1 1)A plane. Therefore, the current confining layer 105 shown in FIG. 11 has an n-type region under the flat surface and a p-type region under the slanted surface. Also in this case, it is preferable to select a V/III ratio which allows the carrier concentration to be set to $1 \times 10^{18} \text{cm}^{-3}$ in the n- and p-type regions.

On the current confining layer 105, a p-type $Al_xGa_{1-x}Al$ clad layer (e.g. x=0.3) 106 is being formed to a thickness of about 1.6 μm. C is being doped as the p-type impurity in the AlGaAs clad layer 106 to an impurity concentration of $1 \times 10^{18} \text{cm}^{-3}$.

The three layers, the AlGaAs clad layer 104, current confining layer 105, and AlGaAs clad layer 106, therefore, all have a p-type region under the slanted surface of the (3 1 1)A plane. The current confining layer 105 between the AlGaAs clad layers 104 and 106, therefore, has an n-type region under the flat surface.

On the p-type AlGaAs clad layer 106, a p⁺-type GaAs contact layer 107 is being formed to a thickness of about 0.5

μm. C or Zn is being doped as the p-type impurity in the GaAs contact layer 107 to an impurity concentration of $5 \times 10^{18} \text{cm}^{-3}$.

A positive electrode 108 of AuZn is being formed on the GaAs contact layer 107, and a negative electrode 109 of AuSn is being formed on the bottom surface of the GaAs substrate 100. When a voltage is applied between the positive and negative electrodes 108 and 109, the p-n junction between the current confining layer 105 and the clad layer 104 is backward biased. Therefore, current will not flow in the region under the flat surface, but is concentrated upon the region under the slanted surface. It is therefore possible to efficiently radiate laser beams in the region of the active layer 103 under the slanted surface. (0 1 $\bar{1}$) planes or (0 $\bar{1}$ 1) planes obtained by cleaving a wafer are used for forming a laser resonator (cavity).

In FIG. 11, the (3 1 1)A plane is used for the slanted region. Another plane in the range from a (1 1 1)A plane to a (3 1 1)A plane having a carbon capture amount larger than a (1 0 0) plane may also be used.

Figure 12:
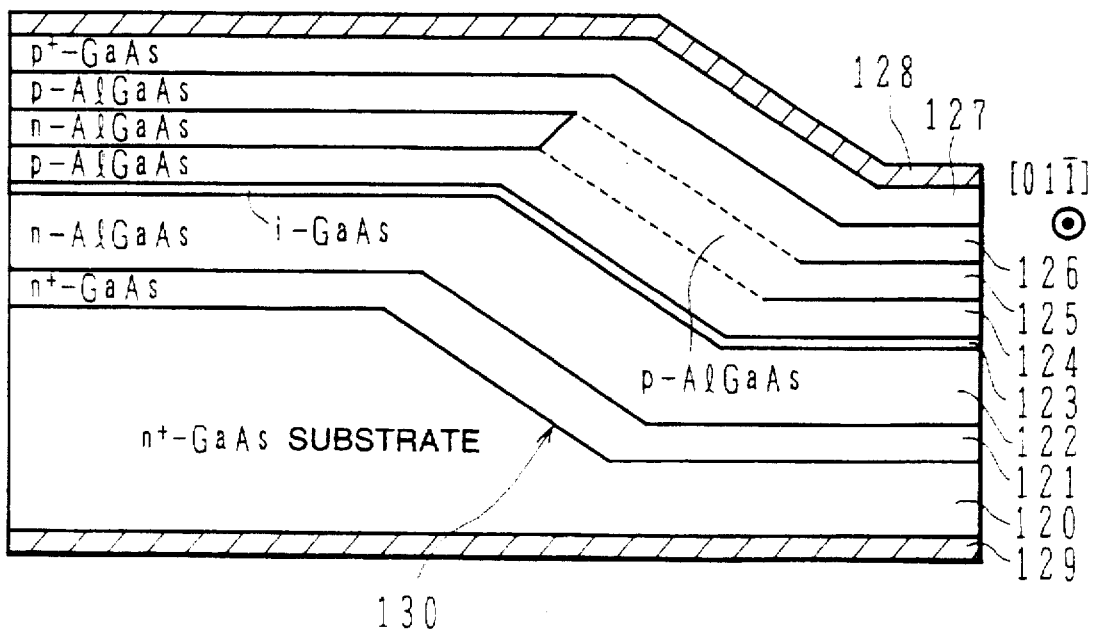
FIG. 12 is a cross sectional view of a semiconductor laser according to a fourth embodiment of the invention.

FIG. 12 is a cross sectional view of a semiconductor laser according to the fourth embodiment of the invention. The semiconductor laser of the fourth embodiment is formed by utilizing a difference of an impurity capture amount between a plane in the range from a (5 1 1)A plane to a (4 1 1)A plane and a (3 1 1)A plane. On the surface of an n$^+$-type GaAs substrate 120 having the plane in the range from the (5 1 1)A plane to the (4 1 1)A plane on its main surface, a step 130 is being formed having a slanted surface of generally the (3 1 1)A plane and extending in the [0 1 $\bar{1}$] direction.

Similar to the semiconductor laser shown in FIG. 11, on the n$^+$-type GaAs substrate 120, an n$^+$-type GaAs buffer layer 121, an n-type AlGaAs clad layer 122, an undoped GaAs or AlGaAs active layer or a GaAs/InGaAs/GaAs strained quantum well active layer 123, a p-type AlGaAs clad Layer 124, a current confining layer 125, a p-type AlGaAs clad layer 126, and a p$^+$-type GaAs contact layer 127 are be formed.

A positive electrode 128 of AuZn is formed on the p$^+$-type GaAs contact layer 127, and a negative electrode 129 of AuSn is formed on the bottom surface of the n$^+$-type GaAs substrate 120.

The current confining layer 125 is epitaxially grown by doping both C and Si at the same time under the conditions that an n-type region is formed at the plane in the range from the (4 1 1)A plane to the (5 1 1)A plane and a p-type region is formed at the (3 1 1)A plane as indicated by the broken line a or a1 in the upper diagram of FIG. 7. With the epitaxial growth of the current confining layer 125 under such conditions, the current confining layer 125 of this embodiment has an n-type region under the flat surface and a p-type region under the slanted surface, like the third embodiment shown in FIG. 11.

In FIG. 12, the plane in the range from the (4 1 1)A plane to the (5 1 1)A plane is used at the main surface of a substrate, and the (3 1 1)A plane is used at the slanted surface of the substrate. A (n 1 1)A plane (n is a real number of about 4≦n) may be used at the main surface of a substrate, and a plane in the range from a (1 1 1)A plane to a (3 1 1)A plane may be used at the slanted surface.

Figure 13:
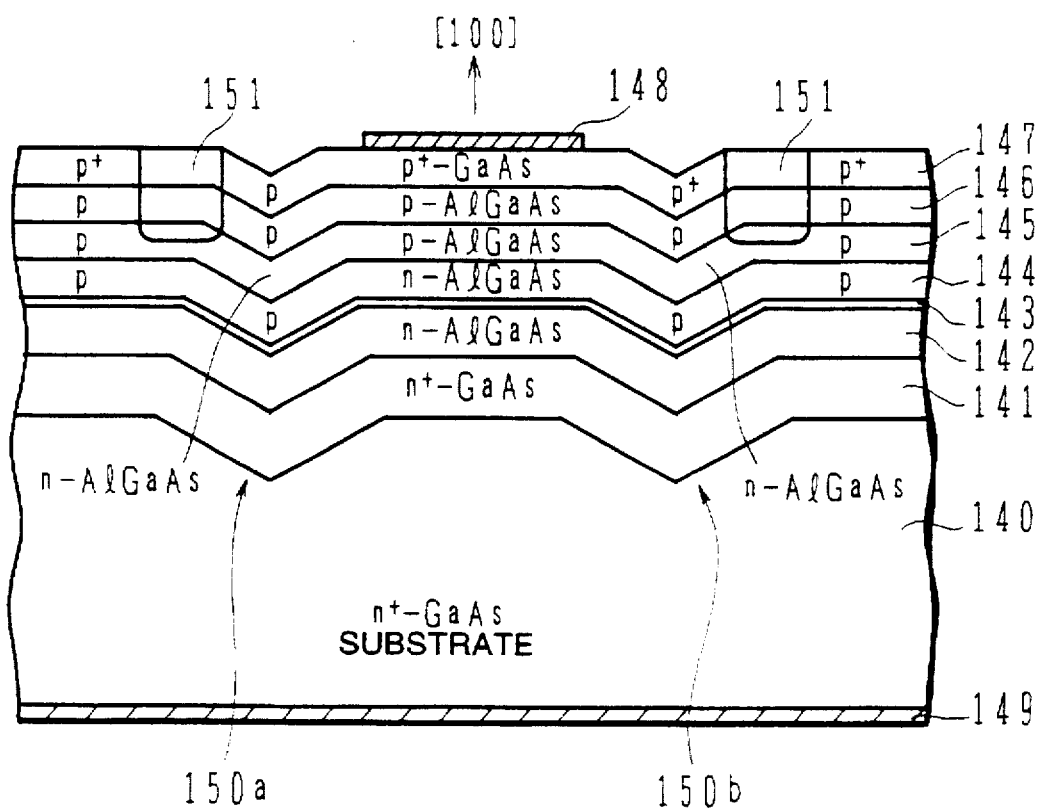
FIG. 13 is a cross sectional view of a semiconductor laser according to a fifth embodiment of the invention.

FIG. 13 is a cross sectional view of a semiconductor laser according to the fifth embodiment of the invention. The semiconductor laser of the fifth embodiment is formed by utilizing a difference of an impurity capture amount between a (1 0 0) plane, and a (4 1 1)A plane or a (4 1 1)B plane. On the surface of an n$^+$-type GaAs substrate 140 having the (1 0 0) plane on its main surface, grooves 150a and 150b of a V-shape spaced apart by a predetermined distance are formed, having a slanted surface of generally the (4 1 1)A plane and extending in the [0 1 $\bar{1}$] direction. Alternatively, a substrate may be used which has grooves of a V-shape spaced apart by a predetermined distance, the grooves having a slanted surface of generally the (4 1 1)B plane and extending in the [0 1 1] direction.

Similar to the semiconductor laser shown in FIG. 11, on the n$^+$-type GaAs substrate 140, an n$^+$-type GaAs buffer layer 141, an n-type AlGaAs clad layer 142, an undoped GaAs or AlGaAs active layer or a GaAs/InGaAs/GaAs strained quantum well active layer 143, a p-type AlGaAs clad layer 144, a current confining layer 145, a p-type AlGaAs clad layer 146, and a p$^+$-type GaAs contact layer 147 are formed.

A positive electrode 148 of AuZn is formed on the p$^+$-type GaAs contact layer 147, and a negative electrode 149 of AuSn is formed on the bottom surface of the n$^+$-type GaAs substrate 140.

Near the boundaries between the regions under the outside slanted surfaces of the two grooves 150a and 150b and the regions under the outside flat surfaces, high resistance regions 151 are formed by ion implantation from the surface of the p$^+$-type GaAs contact layer 147 to the middle level of the current confining layer 145. These high resistance regions 151 electrically isolate adjacent devices.

The current confining layer 145 is epitaxially grown by doping both C and Si at the same time under the conditions that an n-type region is formed at the (4 1 1)A plane or the (4 1 1)B plane and a p-type region is formed at the (1 0 0) plane as indicated by the broken line a in the upper drawing of FIG. 7. With the epitaxial growth of the current confining layer 145 under such conditions, the current confining layer 145 of this embodiment has an n-type region under the slanted surface and a p-type region under the flat surface, opposite to the embodiments shown in FIGS. 11 and 12.

Upon application of a voltage between the electrodes 148 and 149, the p-n junction at the region under the slanted surface is reverse biased. Therefore, current flows through and concentrates upon the region under the flat surface.

In FIG. 13, although the (4 1 1) plane or the (4 1 1)B plane is used at the slanted surface of a substrate, a (n 1 1)A plane or a (n 1 1)B plane (n is a real number of about 4≦n) may be used which has a carbon capture amount smaller than the (1 0 0) plane.

As described above, the third to fifth embodiments can epitaxially grow a current confining layer in a self-alignment manner by selecting a proper V/III ratio or by doping C and Si at the same time at a proper crystal orientation. As explained with FIG. 9, group VI elements such as S and Se may be used instead of Si.

Next, the sixth embodiment will be described with reference to FIGS. 14A and 14B.

Figure 14A:
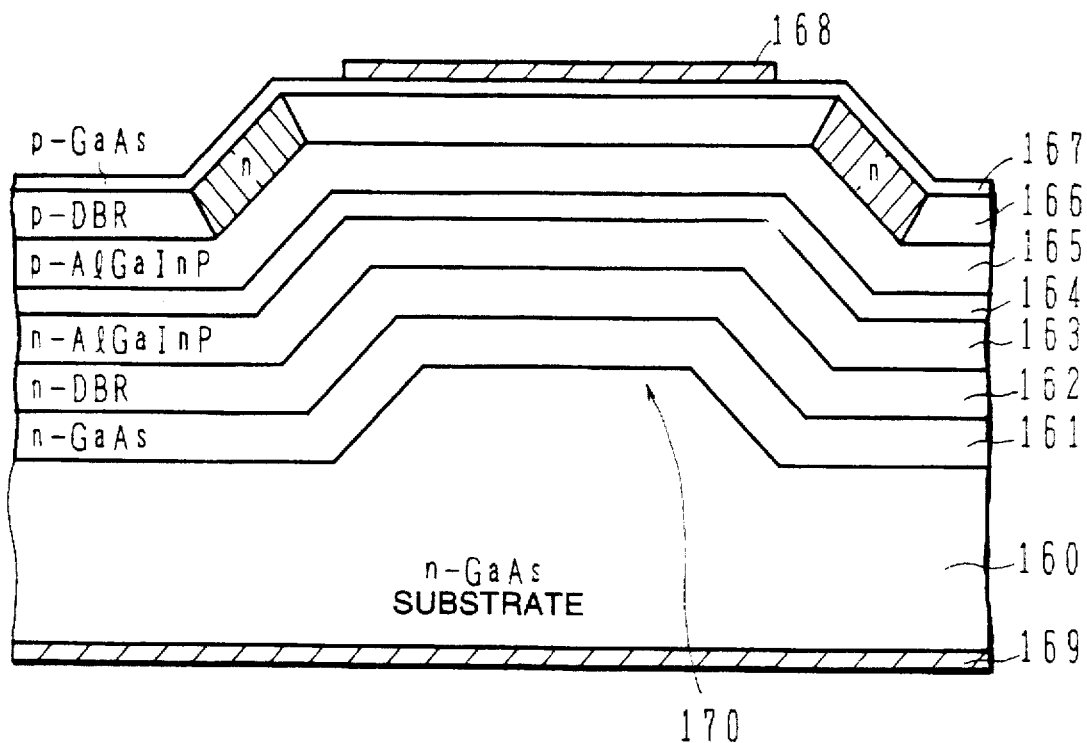
FIGS. 14A and 14B are a cross sectional view and a perspective view of a semiconductor Laser according to a sixth embodiment of the invention.

FIG. 14A is a cross sectional view of a surface emission type semiconductor laser according to the sixth embodiment of the invention. An n-type GaAs substrate having a (1 0 0) plane on its main surface is being doped with Si as the n-type impurity to an impurity concentration of $4 \times 10^{18} \text{cm}^{-3}$. On the surface of the GaAs substrate 160, a mesa 170 is being formed having a slanted surface tilted by 15° to 35° from the main surface of the substrate.

Figure 14B:
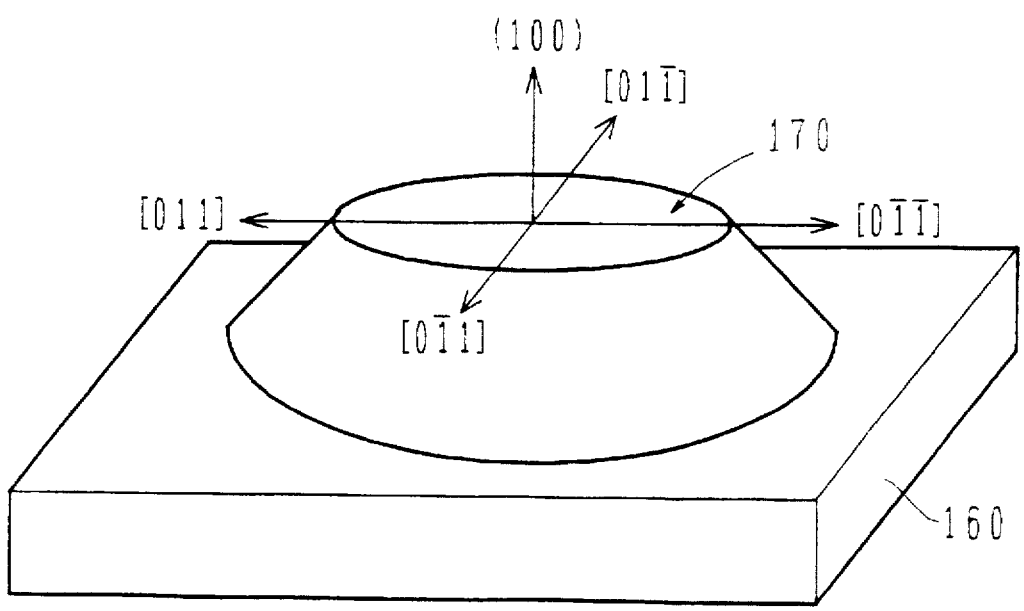

FIG. 14B is a perspective view of the mesa 170 formed on the surface of the GaAs substrate 160. The slanted surface of the mesa 170 includes the plane A components and plane B components. As shown in the upper diagram in FIG. 7, if an epitaxial growth is performed under the Si and C doping conditions indicated by the broken line a, the region under the B planes becomes an n-type in the range from 15° to 35° and the region under the A planes becomes an n-type in the range from 15° to 20°. Accordingly, if the slanted surface is formed at the A or B planes in these angle ranges, an epitaxial layer can be formed having a p-type region under the flat surface and an n-type region under the slanted surface, by doping both C and Si at the same time.

On the GaAs substrate 160, an n-type GaAs buffer layer 161 is formed to a thickness of 1.0 μm. Si is doped as the n-type impurity to an impurity concentration of $1 \times 10^{18} \text{cm}^{-3}$.

On the n-type GaAs buffer layer 161, an n-type distributed Bragg reflection (DBR) layer 162 of a thin film multi-layer type is formed, the layer 162 being made of a combination of layers such as $Al_xGa_{1-x}As/Al_yGa_{1-y}As$.

On the n-type DBR layer 162, a Si-doped n-type $(Al_{0.7}Ga_{0.3})_{0.5}In_{0.5}P$ clad layer 163 is formed.

On the n-type AlGaInP clad layer 163, a laser structure 164 is formed. The laser structure 164 has a strained quantum well active layer made of an undoped $(Al_xGa_{1-x})_{0.5}In_{0.5}P$ well layer (e.g. $x \leq 0.1$)or a $(Ga_xIn_{1-x})(As_yP_{1-y})$ well layer (e.g. $x=0.4$, $y=0.1$) and an $(Al_{0.4}Ga_{0.6})_{0.5}In_{0.5}P$ barrier layer, and n- and p-type $(Al_{0.4}Ga_{0.6})_{0.5}In_{0.5}P$ guide layers sandwiching the active layer.

On the Laser structure 164, a Zn-doped p-type $Al_{0.7}Ga_{0.3})_{0.5}P$ clad layer 165 is formed. On the p-type AlGaInP clad layer 165, a p-type $Al_xGa_{1-x}As/Al_yGa_{1-y}As$ DBR layer 166 is formed. On the p-type DBR layer 166, a C- or Zn-doped p-type GaAs contact layer 167 is formed. A positive electrode 168 of AuZn is formed on the region under the flat surface of the p-type GaAs contact layer, and a negative electrode 169 of AuSn is formed on the bottom surface of the n-type GaAs substrate 160.

The conductivity type of the region under the flat surface of the DBR layer can be made a p-type and that of the region under the slanted surface thereof can be made an n-type, by selecting a proper V/III ratio if a group III source material containing carbon is used, or by properly adjusting the dope amount of carbon if a carbon source material only is used. Alternatively, by property adjusting the dope amounts of C and Si and doping them at the same time, the conductivity types of the regions under the flat surface and the slanted surface can also be made a p-type and an n-type, respectively.

The above-described structure is for a surface emission type laser having an oscillation wavelength of a 0.6 μm band. A surface emission type laser having an oscillation wavelength of a 0.78 to 0.98 μm band may also be formed, by replacing the n-type AlGaInP clad layer 163 by an n-type $Al_xGa_{1-x}As$ (e.g. $x=0.3$) layer, the laser structure 164 by a laser structure made of a GaAs barrier layer and an $In_xGa_{1-x}As$ (e.g. $x=0.2$)strained active layer, and the p-type AlGaInP clad layer 165 by a C-doped p-type $Al_xGa_{1-x}As$ (e.g. $x=0.3$) clad layer. In this case, similar to the above-described method, the current confining layer can be formed in a self-alignment manner when the p-type AlGaAs clad layer and p-type DBR layer are formed.

In the above manner, the n-type region surrounding the p-type region under the flat surface can be formed in a self-alignment manner. By applying a voltage between the electrodes 168 and 169, current from the p-type GaAs contact layer passes through the p-type DBR layer 166 and is injected into the laser structure 164. The peripheral area of this current path is formed with a p-n-p junction and one of the p-n junction is reversely biased. Therefore, current can be flowed through and concentrated upon the region of the laser structure 164 under the flat surface.

In the above embodiments, although an epitaxial growth is performed by MOVPE, a group III-V compound semiconductor or mixed crystal such as GaAs and AlGaAs may be epitaxially grown by another epitaxy such as organic molecule beam epitaxy (MOMBE) and chemical beam epitaxy (CBE), with expected similar advantageous effects being obtained.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A semiconductor device, comprising:

a substrate made of a group III-V compound semiconductor and having a flat surface exposing an (n 1 1)A plane, wherein n is a real number of about $1 \leq n \leq$ about 3;

an n-type collector layer epitaxially grown on said substrate;

a p-type base layer epitaxially grown on said n-type layer, said p-type layer containing carbon as the p-type impurity; and an n-type emitter layer epitaxially grown on said p-type base layer, said n-type emitter layer being made of a material having a forbidden band width wider than a forbidden band width of said p-type base layer.

2. A semiconductor device according to claim 1, wherein said collector layer, said p-type base layer, and said n-type emitter layer are made of a group III-V compound semiconductor containing As as the group V element.

3. A semiconductor laser comprising:

a stepped substrate exposing first and second planes having respective, first and second different crystal orientations, said second plane being disposed on both sides of said first plane, and said first and second planes providing respective, first and second different carbon capture amounts in an epitaxial layer to be formed on the surface of said stepped substrate by doping carbon as an impurity;

a first clad layer of a first conductivity type formed on said stepped substrate;

an active layer formed on said first clad layer;

a second clad layer formed on said active layer; and a current confining layer having a region of a second conductivity type opposite to said first conductivity type at said first plane and a region of said first conductivity type at said second plane.

4. A semiconductor laser according to claim 3, wherein:

a V groove, defined by first and second slanted surfaces, is formed on the surface of said stepped substrate;

said second plane corresponds to a main surface of said stepped substrate having a (1 0 0) plane;

said first plane corresponds to both of the first and second slanted surfaces of said V groove having an (n 1 1)A plane, wherein n is a real number of about $1 \leq n \leq$ about 3; and said current confining layer has an n-type region over said second plane and a p-type region over said first plane.

5. A semiconductor laser according to claim 3, wherein:

said second plane corresponds to a main surface of said stepped substrate having an (n 1 1)A plane, wherein n is a real number of 4≦n;

said first plane corresponds to a slanted surface having an (m 1 1)A plane, wherein m is a real number of about 1≦m≦about 3; and said current confining layer has an n-type region at said second plane and a p-type region at said first plane.

6. A semiconductor laser according to claim 3, wherein:

two parallel V grooves, defined by respective pairs of slanted surfaces, are formed on the surface of said stepped substrate;

said first plane corresponds to a flat surface between said two V grooves, the flat surface having a (1 0 0) plane;

said second plane corresponds to the respective pairs of slanted surfaces of said two V grooves, each having an (n 1 1)A plane, wherein n is a real number of about 4<n or an (m 1 1)B plane, wherein m is a real number of about 4<m; and said current confining layer has a p-type region at said first plane and an n-type region at said second plane.

7. A semiconductor laser comprising:

a stepped substrate, made of a group III-V compound semiconductor, comprising a first flat surface exposing a (1 0 0) plane and a mesa structure formed on the first flat surface and an upper, a second flat surface exposing a (1 0 0) plane and a slanted surface having an upper edge surrounding said upper, second flat surface and extending to a lower edge thereof at the first flat surface, the first flat surface surrounding and extending from the lower edge of the slanted surface;

an n-type distributed Bragg reflection layer formed on said stepped substrate;

an n-type clad layer formed on said n-type distributed Bragg reflection layer;

an active layer formed on said n-type clad layer;

a p-type clad layer formed on said active layer and having an upper surface, said p-type clad layer having a p-type region over said flat surface and an n-type region over said slanted surface and extending at least partially thereinto from the upper surface thereof; and a p-type distributed Bragg reflection layer formed on said p-type clad layer, said p-type distributed Bragg reflection layer having a p-type region over said flat surface and an n-type region, containing carbon as an impurity, disposed over said slanted surface of said substrate and contiguous with the n-type region of the p-type clad layer on which the p-type distributed reflection layer is formed.

8. A semiconductor laser comprising:

a stepped substrate, made of a group III-V compound semiconductor, comprising a first flat surface exposing a (1 0 0) plane and a mesa structure formed on the first flat surface and an upper, second flat surface exposing a (1 0 0) plane and a slanted surface having an upper edge surrounding said upper, second flat surface and extending to a lower edge thereof at the first flat surface, the first flat surface surrounding the lower edge of the slanted surface;

an n-type distributed Bragg reflection layer formed on said stepped substrate;

an n-type clad layer formed on said n-type distributed Bragg reflection layer;

an active layer formed on said n-type clad layer;

a p-type clad layer formed on said active layer; and a p-type distributed Bragg reflection layer formed on said p-type clad layer, said p-type distributed Bragg reflection layer having a p-type region over said flat surface and an n-type region containing carbon as an impurity over said slanted surface.

9. A semiconductor device, comprising:

a substrate made of group III-V compound semiconductor and having a crystal orientation tilted by an angle in a range larger than 0° and equal to or smaller than 35° from a (1 0 0) plane toward a (1 1 1)B plane or a crystal orientation tilted by an angle in a range larger than 0° and smaller than 25° from the (1 0 0) plane to a (1 1 1)A plane;

an electron transfer layer formed on said substrate, said electron transfer layer comprising an undoped compound semiconductor layer;

an electron supply layer formed on said electron transfer layer, said electron supply layer being made of a material having a forbidden band width wider than a forbidden band width of said electron transfer layer;

a gate electrode formed on a partial surface area of said electron supply layer and forming a Schottky contact with said electron supply layer; and a source electrode and a drain electrode formed on said electron supply layer, sandwiching said gate electrode therebetween and forming an ohmic contact with said electron transfer layer.

* * * * *

UNITED STATES PATENT AND TRADEMARK OFFICE
CERTIFICATE OF CORRECTION

PATENT NO.  : 5,783,845
DATED       : July 21, 1998
INVENTOR(S) : Makoto KONDO et al.

It is certified that error appears in the above-indentified patent and that said Letters Patent is hereby corrected as shown below:

Title Page, Abstract, line 5, after "plane" insert --,--.

Col. 1,  line 35, change "is" to --as--.

Col. 6,  line 11, change "n-type" to --$n^+$-type--.

Col. 8,  line 53, change "Layer" to --layer--.

Col. 9,  line 53, change "[0111]" to --[011]--.

Col. 10,
         line 64, delete "(".

Col. 12, line 6, change "(loped" to --doped--

Col. 13, line 37, change "Layer" to --layer--.

Col. 15, line 28, change "Laser" to --laser--
         line 29, change "$Al_{0.7}Ga_{0.3})_{0.5}P$" to --$Al_{0.7}Ga_{0.3})_{0.5}In_{0.5}P$--.

UNITED STATES PATENT AND TRADEMARK OFFICE
CERTIFICATE OF CORRECTION

PATENT NO. : 5,783,845
DATED : July 21, 1998
INVENTOR(S) : Makoto KONDO et al.

It is certified that error appears in the above-indentified patent and that said Letters Patent is hereby corrected as shown below:

Col. 17, line 19, change "$4<n$" to --$4 \leq n$--;
line 21, change "$4<m$" to --$4 \leq m$--.

Signed and Sealed this

Tenth Day of August, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO.:     5,783,845
DATED     :     July 21, 1998
INVENTOR(S):    Makoto KONDO et al.

It is certified that error appears in the above-identified patent and that said Letters Patent is hereby corrected as shown below:

Col. 10,    line 29, change "Lower" to --lower--.

Signed and Sealed this

Twenty-first Day of September, 1999

Attest:

Q. TODD DICKINSON

Attesting Officer    Acting Commissioner of Patents and Trademarks